United States Patent
Tsuji

(10) Patent No.: US 12,402,341 B2
(45) Date of Patent: Aug. 26, 2025

(54) METHOD FOR MANUFACTURING SEMICONDUCTOR DEVICE

(71) Applicant: SUMITOMO ELECTRIC INDUSTRIES, LTD., Osaka (JP)

(72) Inventor: Yukihiro Tsuji, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 452 days.

(21) Appl. No.: 18/067,352

(22) Filed: Dec. 16, 2022

(65) Prior Publication Data

US 2023/0290858 A1    Sep. 14, 2023

(30) Foreign Application Priority Data

Mar. 11, 2022 (JP) .................. 2022-038029

(51) Int. Cl.
*H10D 30/01* (2025.01)
*G03F 7/20* (2006.01)
(Continued)

(52) U.S. Cl.
CPC .......... *H10D 30/015* (2025.01); *G03F 7/201* (2013.01); *G03F 7/203* (2013.01);
(Continued)

(58) Field of Classification Search
CPC .......... H01L 21/31144; H01L 27/1225; H10D 64/68; H10D 64/681; H10D 64/683;
(Continued)

(56) References Cited

U.S. PATENT DOCUMENTS

| | | |
|---|---|---|
| 7,501,669 B2 | 3/2009 | Parikh et al. |
| 7,812,369 B2 | 10/2010 | Chini et al. |

(Continued)

FOREIGN PATENT DOCUMENTS

| | | | |
|---|---|---|---|
| CN | 117612937 A * | 2/2024 | ......... H10D 30/4755 |
| JP | 2007-088371 | 4/2007 | |

(Continued)

OTHER PUBLICATIONS

CN 117612937 A—English Machine Translation (Year: 2025).*

*Primary Examiner* — Jose R Diaz
(74) *Attorney, Agent, or Firm* — IPUSA, PLLC

(57) ABSTRACT

A method for manufacturing a semiconductor device, includes forming source and drain electrodes on a semiconductor layer provided above a substrate; forming a first insulating film covering a surface of the semiconductor layer, between the source and drain electrodes, forming a second insulating film on the first insulating film, forming a mask on the second insulating film, the mask having an opening between the source and drain electrodes in a plan view viewed in a direction perpendicular to a substrate surface, forming a first gate opening in the first insulating film and forming a second gate opening in the second insulating film, by etching the first and second insulating films through the opening, and forming a gate electrode on the first and second insulating films, the gate electrode making a Schottky contact with the semiconductor layer through the first and second gate openings.

15 Claims, 33 Drawing Sheets

(51) Int. Cl.
   *H01L 21/02*       (2006.01)
   *H01L 21/027*      (2006.01)
   *H01L 21/311*      (2006.01)
   *H10D 30/47*       (2025.01)
   *H10D 64/01*       (2025.01)
   *H10D 64/27*       (2025.01)

(52) U.S. Cl.
   CPC ...... *H01L 21/0217* (2013.01); *H01L 21/0271* (2013.01); *H01L 21/0274* (2013.01); *H01L 21/31144* (2013.01); *H10D 30/061* (2025.01); *H10D 30/4755* (2025.01); *H10D 64/01* (2025.01); *H10D 64/411* (2025.01)

(58) Field of Classification Search
   CPC .............. H10D 64/64; H10D 30/6738; H10D 30/47–476; H10D 30/0015; H10D 86/423; H10D 30/015; G03F 7/201
   See application file for complete search history.

(56) References Cited

U.S. PATENT DOCUMENTS

| | | | | |
|---|---|---|---|---|
| 2007/0018199 A1* | 1/2007 | Sheppard | ............. | H10D 30/015 |
| | | | | 257/E29.127 |
| 2013/0083568 A1 | 4/2013 | Makiyama et al. | | |
| 2021/0280678 A1* | 9/2021 | Patel | ................... | H10D 64/111 |

FOREIGN PATENT DOCUMENTS

| | | |
|---|---|---|
| JP | 2013-077621 | 4/2013 |
| JP | 2016-157983 | 9/2016 |

\* cited by examiner

METHOD FOR MANUFACTURING SEMICONDUCTOR DEVICE

CROSS-REFERENCE TO RELATED APPLICATIONS

This application is based upon and claims priority to Japanese Patent Application No. 2022-038029, filed on Mar. 11, 2022, the entire contents of which are incorporated herein by reference.

TECHNICAL FIELD

The present disclosure relates to methods for manufacturing semiconductor devices.

BACKGROUND

For a high electron mobility transistor (HEMT), there is a proposed structure in which a portion of a gate electrode extending on an insulating film toward a drain electrode is larger than a portion of the gate electrode extending on the insulating film toward a source electrode, in order to reduce electric field concentration. If the portion of the gate electrode extending on the insulating film toward the source electrode were large, an electrostatic capacitance between the gate electrode and a channel (two-dimensional electron gas) would become large.

Related art include Japanese Laid-Open Patent Publication No. 2013-77621, Japanese Laid-Open Patent Publication No. 2016-157983, Japanese Laid-Open Patent Publication No. 2007-88371, U.S. Pat. Nos. 7,501,669, and 7,812,369, for example.

According to related methods for manufacturing semiconductor devices, it is difficult to simultaneously relax the electric field concentration and reduce an increase in the electrostatic capacitance.

SUMMARY

It is one object of the present disclosure to provide a method for manufacturing a semiconductor device capable of simultaneously relaxing of the electric field concentration and reducing an increase in the electrostatic capacitance.

According to one aspect of the present disclosure, a method for manufacturing a semiconductor device, includes forming a semiconductor layer above a substrate; forming a source electrode and a drain electrode on the semiconductor layer; forming a first insulating film covering a surface of the semiconductor layer, between the source electrode and the drain electrode; forming a second insulating film on the first insulating film; forming a mask on the second insulating film, the mask having an opening between the source electrode and the drain electrode in a plan view viewed in a direction perpendicular to an upper surface of the substrate; forming a first gate opening in the first insulating film and forming a second gate opening in the second insulating film, by etching the first insulating film and the second insulating film through the opening; and forming a gate electrode on the first insulating film and the second insulating film, the gate electrode making a Schottky contact with the semiconductor layer through the first gate opening and the second gate opening, wherein the opening includes a first side surface, and a second side surface closer to the drain electrode than the first side surface is to the drain electrode, an angle formed between the first side surface and the upper surface is larger than an angle formed between the second side surface and the upper surface, and an etching rate of the second insulating film is higher than an etching rate of the first insulating film during the etching of the forming the first gate opening.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1:
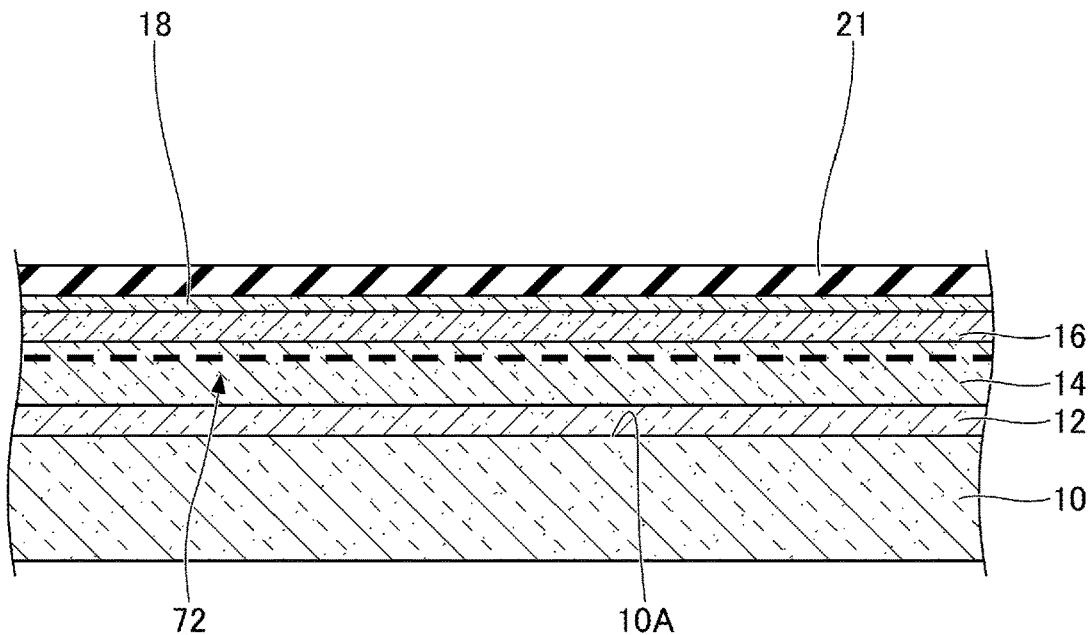
FIG. 1 is a cross sectional view (part 1) illustrating a method for manufacturing a semiconductor device according to a first embodiment.

A description will hereinafter be given of embodiments of the present invention with reference to the drawings.

[1] A method for manufacturing a semiconductor device according to one aspect of the present disclosure, includes: forming a semiconductor layer above a substrate; forming a source electrode and a drain electrode on the semiconductor layer; forming a first insulating film covering a surface of the semiconductor layer, between the source electrode and the drain electrode; forming a second insulating film on the first insulating film; forming a mask on the second insulating film, the mask having an opening between the source electrode and the drain electrode in a plan view viewed in a direction perpendicular to an upper surface of the substrate; forming a first gate opening in the first insulating film and forming a second gate opening in the second insulating film, by etching the first insulating film and the second insulating film through the opening; and forming a gate electrode on the first insulating film and the second insulating film, the gate electrode making a Schottky contact with the semiconductor layer through the first gate opening and the second gate opening, wherein the opening includes a first side surface, and a second side surface closer to the drain electrode than the first side surface is to the drain electrode, an angle formed between the first side surface and the upper surface is larger than an angle formed between the second side surface and the upper surface, and an etching rate of the second insulating film is higher than an etching rate of the first insulating film during the etching of the forming the first gate opening.

In the opening formed in the mask, the angle formed between the first side surface on the side closer to the source electrode and the upper surface of the substrate, is larger than the angle formed between the second side surface on the side closer to the drain electrode and the upper surface of the substrate. For this reason, the opening of the mask can easily widen on the side closer to the drain electrode than on the side closer to the source electrode during etching. Further, during the etching, the etching rate of the second insulating film is higher than the etching rate of the first insulating film. Hence, the second gate opening formed in the second insulating film is more easily affected by the shape of the opening of the mask than the first gate opening formed in the first insulating film. Accordingly, the portion of the first insulating film exposed from the second insulating film can easily widen on the side closer to the drain electrode than on the side closer to the source electrode. Thus, the portion of the gate electrode extending on the first insulating film toward the drain electrode can be made larger than the portion of the gate electrode extending on the first insulating film toward the source electrode. As a result, it is possible to simultaneously relax the electric field concentration and reduce the increase in the electrostatic capacitance.

[2] In [1], a distance between the first gate opening and the second gate opening on a side closer to the drain electrode than the first gate is to the drain electrode opening may be longer than a distance between the first gate opening and the second gate opening on a side closer to the source electrode than the first gate opening is to the source electrode. In this case, it is easy to simultaneously relax of the electric field concentration and reduce an increase in the electrostatic capacitance.

[3] In [1] or [2], an angle between the first side surface and the upper surface may be in a range greater than or equal to 85° and less than or equal to 90°, and an angle between the second side surface and the upper surface may be in a range greater than or equal to 45° and less than or equal to 60°. In this case, particularly during the etching, the opening of the mask can easily widen on the side closer to the drain electrode than on the side closer to the source electrode.

[4] In any one of [1] to [3], the first insulating film may be a first silicon nitride film having a first refractive index, and the second insulating film may be a second silicon nitride film having a second refractive index lower than the first refractive index. In this case, the etching rate of the second insulating film can easily be made higher than the etching rate of the first insulating film.

[5] In any one of [1] to [4], the forming the mask may include forming a positive photosensitive film on the second insulating film, exposing the photosensitive film to form a photosensitive region in a portion of the photosensitive film where the opening is to be formed, and removing the photosensitive region by developing the photosensitive film, and the exposing the photosensitive film may include an exposure from a direction parallel to the first side surface, and exposure from a direction parallel to the second side surface. In this case, it is easy to form the opening with high accuracy.

[6] In any one of [1] to [4], the forming the mask may include forming a positive photosensitive film on the second insulating film, exposing the photosensitive film by a single exposure using a shifted telecentric optical system, to form a photosensitive region in a portion of the photosensitive film where the opening is to be formed, and removing the photosensitive region by developing the photosensitive film. In this case, the opening can easily be formed with a particularly high accuracy.

[7] In any one of [1] to [4], the forming the mask may include planarizing an upper surface of the second insulating film, forming an uncured film of a resin on the planarized second insulating film, forming a cured film by curing the uncured film while pressing a mold against the uncured film, and removing the mold from the cured film, and the mold may include a base, and a protrusion protruding from the base and having a shape corresponding to a shape of the opening. In this case, the mask can easily be formed with a high accuracy.

[8] In [7], the resin may be an ultraviolet curable resin, and the forming the cured film may include irradiating ultraviolet light on the uncured film through the mold. In this case, the mask can easily be formed with a high accuracy.

[9] In [7] or [8], the source electrode and the drain electrode may extend in a first direction parallel to the upper surface, and be alternately formed at multiple locations in a second direction parallel to the upper surface and perpendicular to the first direction, and the gate electrode may be formed at each location between the source electrode and the drain electrode that are adjacent to each other in the second direction. In this case, a transistor having a finger gate structure can easily be formed.

[10] In any one of [1] to [9], an etching rate of the second insulating film may be four times or more higher than an etching rate of the first insulating film during the etching of the forming the first gate opening. In this case, the portion of the first insulating film exposed from the second insulating film can easily be made larger on the side closer to the drain electrode that on the side closer to the source electrode.

Details of Embodiments of Present Disclosure

Hereinafter, embodiments of the present disclosure will be described in detail, but the present disclosure is not limited to the described embodiments. In the present specification and drawings, constituent elements having substantially the same functional configuration are denoted by the same reference numerals, a redundant description thereof may be omitted.

First Embodiment

A first embodiment will be described. The first embodiment relates to a method for manufacturing a semiconductor device including a GaN-HEMT having a nitride semiconductor as a main constituent material thereof. FIG. 1 through FIG. 13 are cross sectional views illustrating the method for manufacturing the semiconductor device according to the first embodiment.

First, as illustrated in FIG. 1, a buffer layer 12, an electron transit layer (or channel layer) 14, an electron supply layer (or barrier layer) 16, and a capping layer 18 are successively formed on a substrate 10. The substrate 10 is a silicon carbide (SiC) substrate having an upper surface that is (0001)-oriented, for example. The buffer layer 12 is an aluminum nitride (AlN) layer having a thickness in a range greater than or equal to 5 nm and less than or equal to 100 nm, for example. The electron transit layer 14 is an undoped gallium nitride (GaN) layer having a thickness of approximately 1000 nm, for example. The electron supply layer 16 is an n-type aluminum gallium nitride (AlGaN) layer having a thickness of approximately 20 nm, for example. The capping layer 18 is an n-type GaN layer having a thickness of approximately 5 nm, for example. An n-type impurity used in this embodiment is silicon (Si) or germanium (Ge), for example. A laminating direction of the buffer layer 12, the electron transit layer 14, the electron supply layer 16, and the capping layer 18 is the [0001]-direction, for example. The buffer layer 12, the electron transit layer 14, the electron supply layer 16, and the capping layer 18 are formed by metal organic chemical vapor deposition (MOCVD), for example. A two-dimensional electron gas (2DEG) 72 is present near an upper surface of the electron transit layer 14. A laminated structure formed by the buffer layer 12, the electron transit layer 14, the electron supply layer 16, and the capping layer 18, is an example of a semiconductor layer.

Next, a first insulating film 21 is formed on the capping layer 18. The first insulating film 21 is a silicon nitride (SiN) film, for example. The first insulating film 21 has a thickness in a range greater than or equal to 10 nm and less than or equal to 20 nm, for example. The silicon nitride film (an example of a first silicon nitride film) used for the first insulating film 21 is preferably has a composition represented by a formula $Si_2N_3$. A refractive index of the $Si_2N_3$ is 2.0. The first insulating film 21 can be formed by chemical vapor deposition (CVD), for example.

Figure 2:
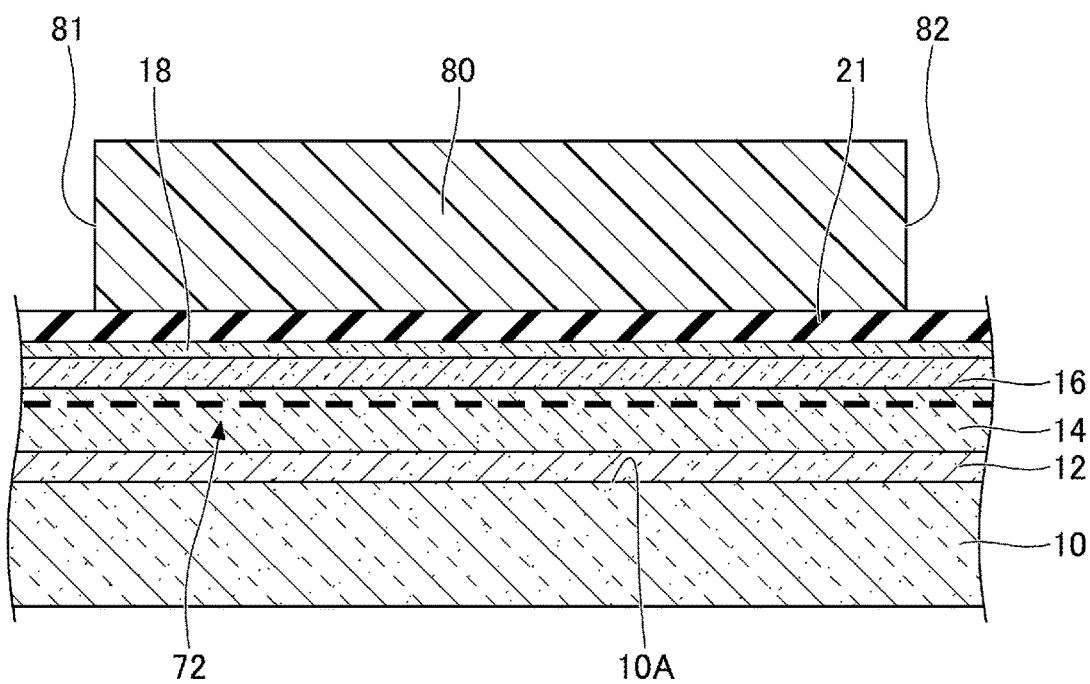
FIG. 2 is a cross sectional view (part 2) illustrating the method for manufacturing the semiconductor device according to the first embodiment.

Next, as illustrated in FIG. 2, a resist mask 80 is formed on the first insulating film 21. The resist mask 80 has an opening 81 that exposes a portion of the first insulating film 21, and an opening 82 that exposes another portion of the first insulating film 21.

Figure 3:
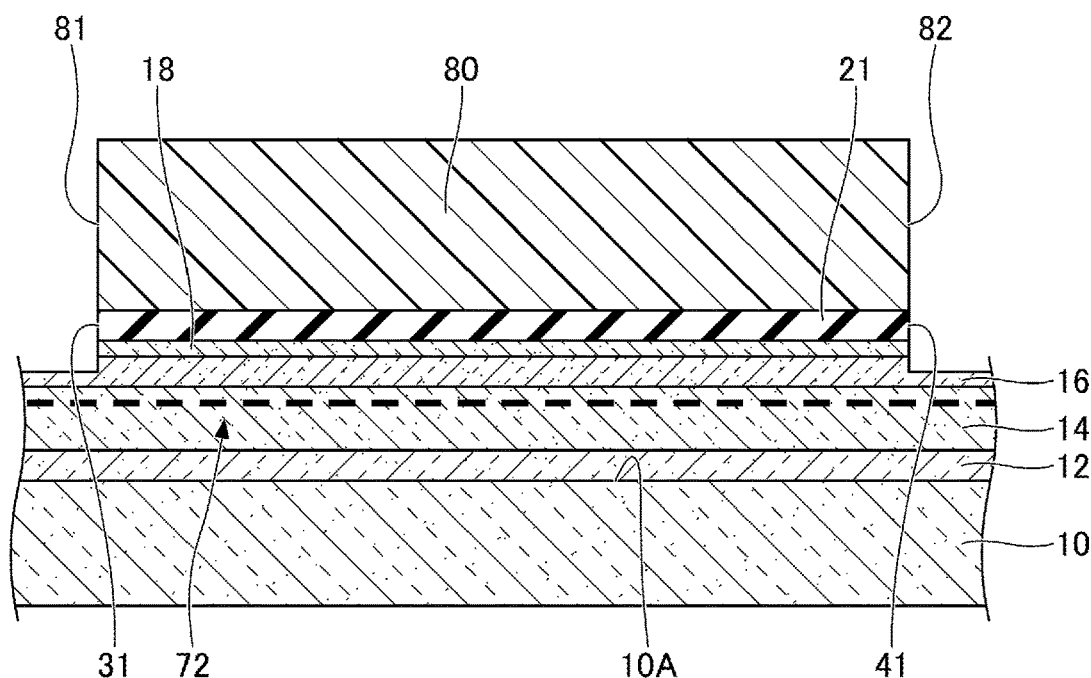
FIG. 3 is a cross sectional view (part 3) illustrating the method for manufacturing the semiconductor device according to the first embodiment.

Next, as illustrated in FIG. 3, openings 31 and 41 are formed in the first insulating film 21, the capping layer 18, and the electron supply layer 16 by reactive ion etching (RIE). The opening 31 is communicates to the opening 81, and the opening 41 communicates to the opening 82. A reactive gas including fluorine (F) may be used to etch the first insulating film 21. A reactive gas including chlorine (Cl) may be used to etch the capping layer 18 and the electron supply layer 16. The openings 31 and 41 are formed to a depth such that a portion of the electron supply layer 16 remains, for example.

Figure 4:
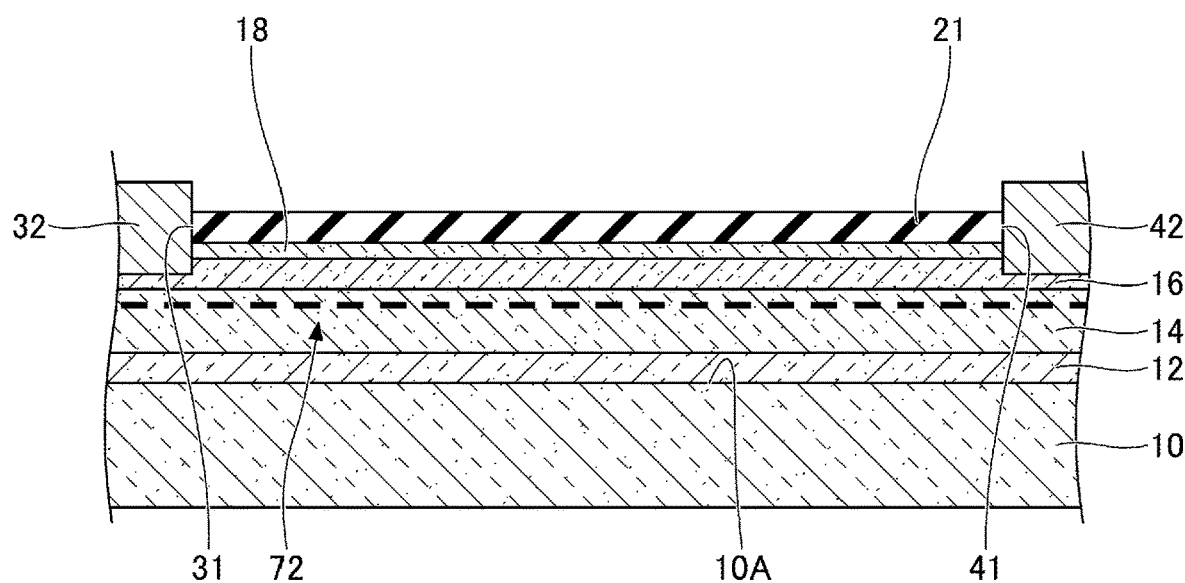
FIG. 4 is a cross sectional view (part 4) illustrating the method for manufacturing the semiconductor device according to the first embodiment.

Next, as illustrated in FIG. 4, a source electrode 32 is formed in the opening 31, and a drain electrode 42 is formed in the opening 41. When forming the source electrode 32 and the drain electrode 42, a metal film is formed by vacuum deposition in a state where the resist mask 80 remains, and the resist mask 80 is removed after forming the metal film. Although the metal film is formed not only inside the openings 31 and 41 but also on the resist mask 80, the metal film on the resist mask 80 is removed when the resist mask 80 is removed. In other words, lift-off of the metal film together with the resist mask 80 is performed. The resist mask 80 can be removed using an organic solvent, for example. An alloying heat treatment is performed after the resist mask 80 is removed. The source electrode 32 and the drain electrode 42 include a Ta film and an Al film, for example. The source electrode 32 and the drain electrode 42 make ohmic contact with the 2DEG 72.

Figure 5:
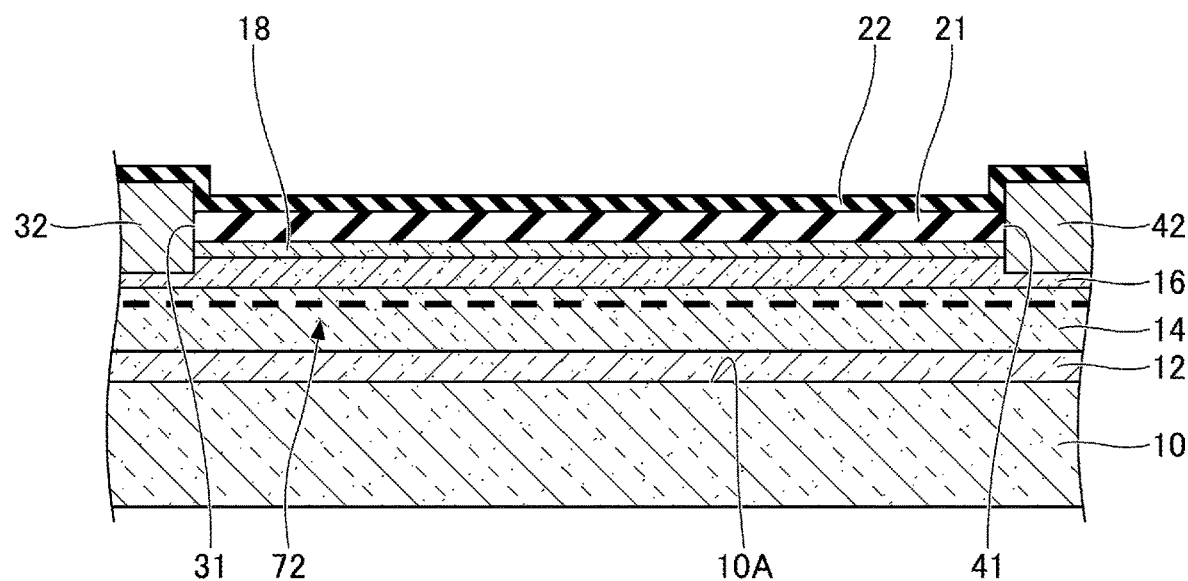
FIG. 5 is a cross sectional view (part 5) illustrating the method for manufacturing the semiconductor device according to the first embodiment.

Next, as illustrated in FIG. 5, A second insulating film 22 is formed on the first insulating film 21, the source electrode 32, and the drain electrode 42. The second insulating film 22 is a silicon nitride (SiN) film, for example. The second insulating film 22 may be thicker than the first insulating film 21. The second insulating film 22 has a thickness in a range greater than or equal to 30 nm and less than or equal to 40 nm, for example. A density of the second insulating film 22 is preferably lower than a density of the first insulating film 21. In addition, a refractive index (an example of a second refractive index) of the second insulating film 22 is preferably lower than the refractive index (an example of a first refractive index) of the first insulating film 21. The refractive index of the silicon nitride film (an example of a second silicon nitride film) used for the second insulating film 22 is 1.85, for example. The second insulating film 22 can be formed by CVD, for example.

Figure 6:
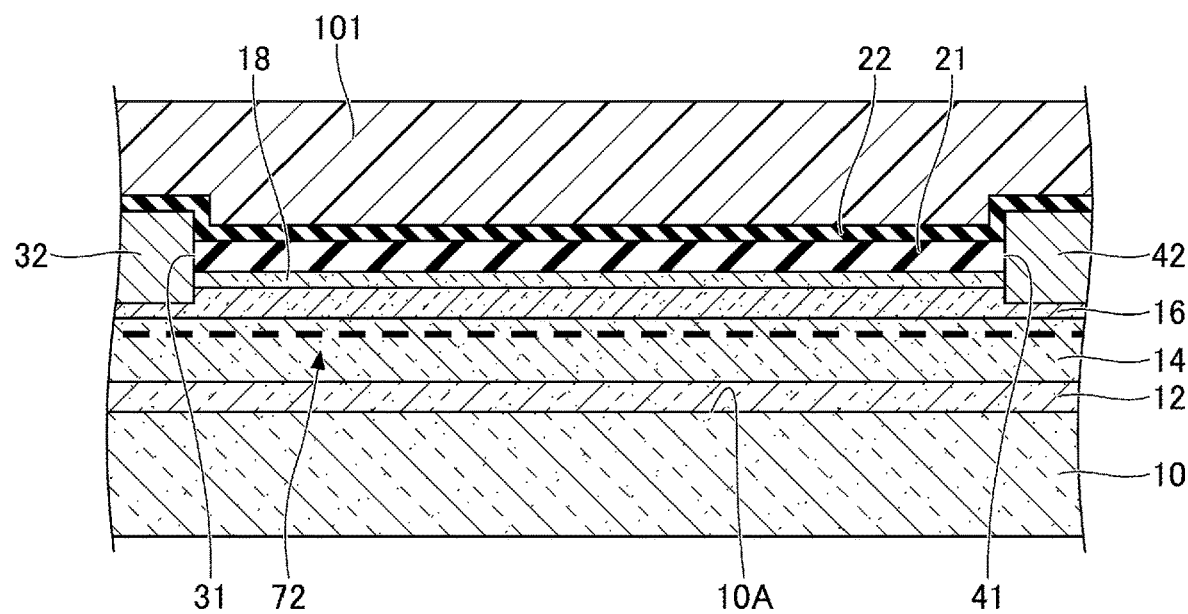
FIG. 6 is a cross sectional view (part 6) illustrating the method for manufacturing the semiconductor device according to the first embodiment.

Next, as illustrated in FIG. 6, a positive photoresist film 101 is formed on the second insulating film 22. The photoresist film 101 is an example of a photosensitive film.

Figure 7:
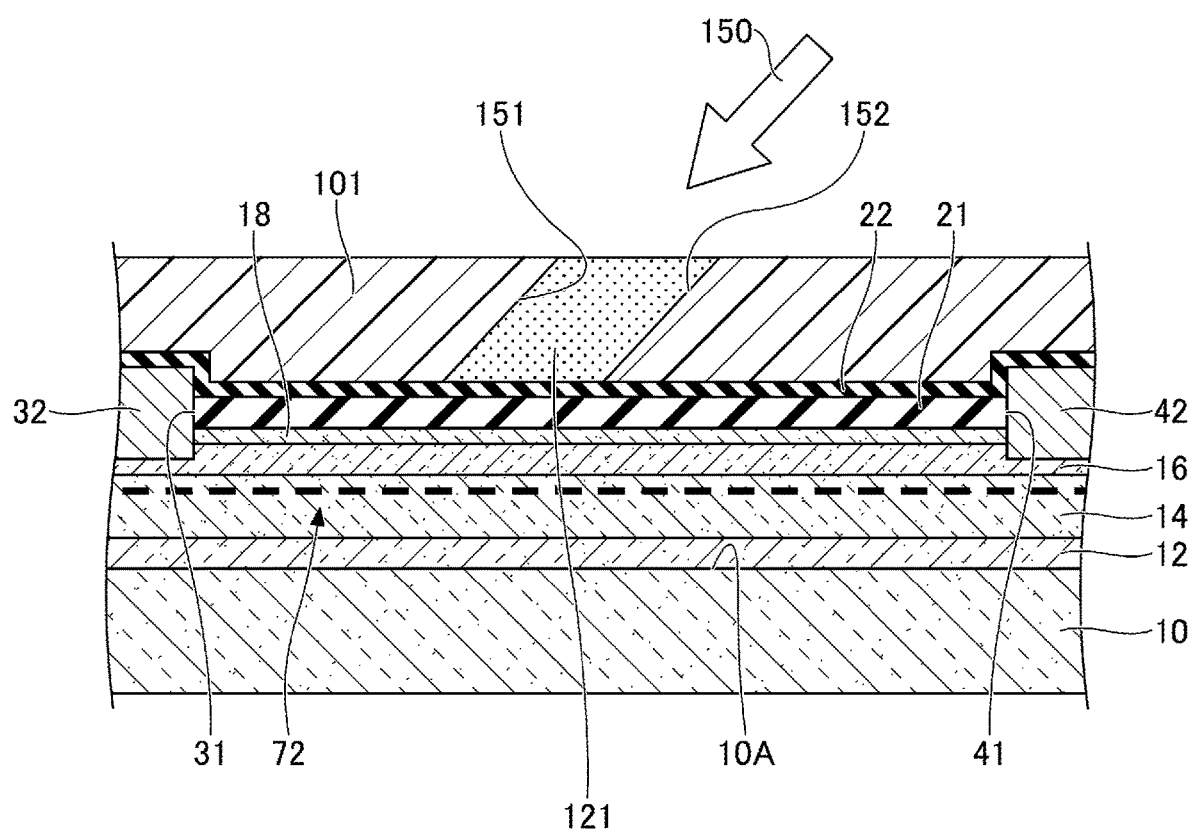
FIG. 7 is a sectional view (part 7) illustrating the method for manufacturing the semiconductor device according to the first embodiment.

Next, as illustrated in FIG. 7, a photosensitive region 121 is formed, by exposure, in a portion of the photoresist film 101 between the source electrode 32 and the drain electrode 42. The exposure is performed by reduction exposure, for example. When performing the exposure, light 150 is irradiated from a direction inclined from a direction perpendicular to an upper surface 10A of the substrate 10 toward the drain electrode 42. The photosensitive region 121 has side surfaces 151 and 152 that are parallel to each other in a cross sectional view thereof. The side surface 151 is closer to the source electrode 32 than the side surface 152 is to the source electrode 32. An angle formed by the upper surface 10A and the side surfaces 151 and 152 may be in a range greater than or equal to 45° and less than or equal to 60°, for example. The photosensitive region 121 has a cross section having a parallelogram shape.

Figure 8:
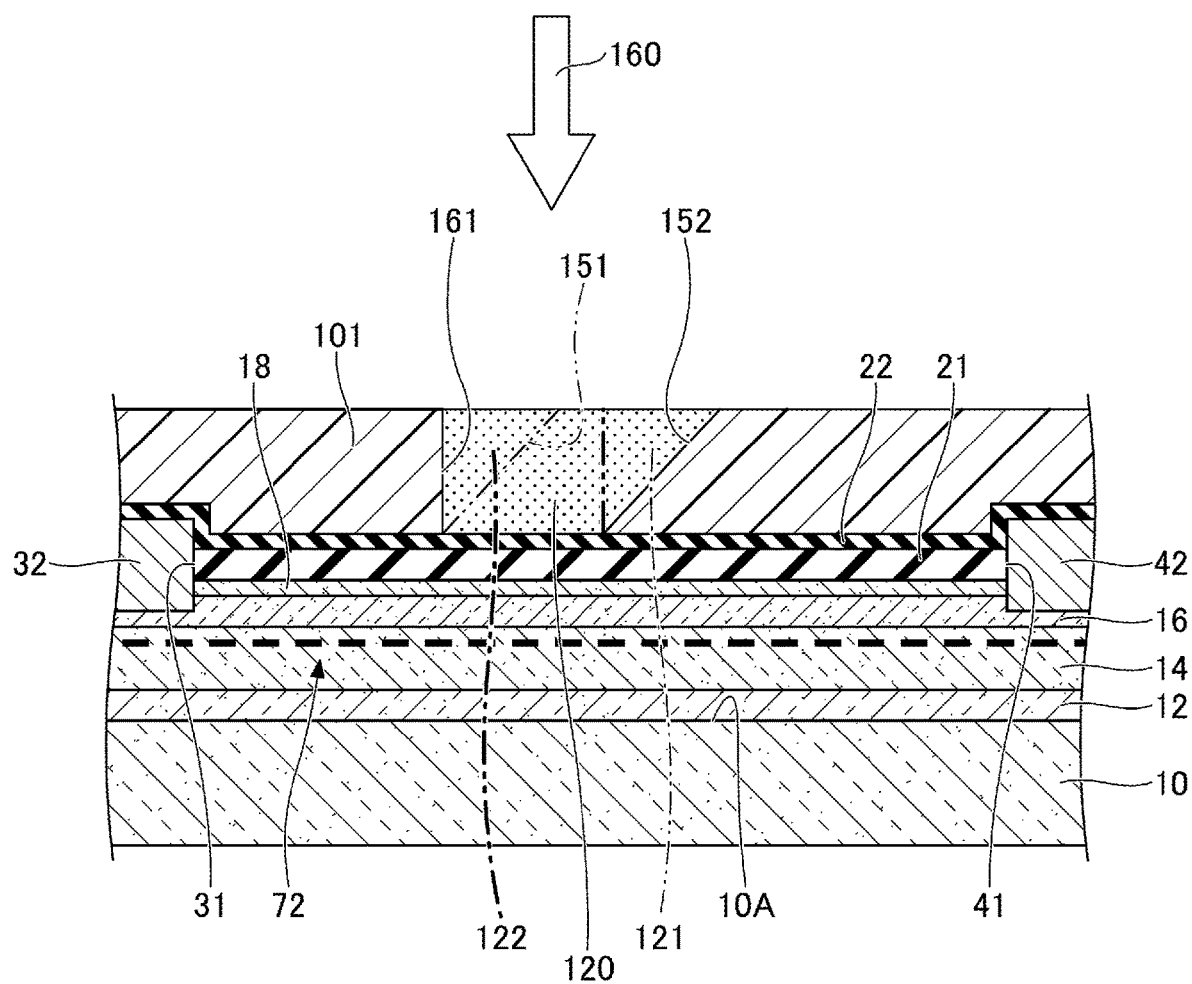
FIG. 8 is a cross sectional view (part 8) illustrating the method for manufacturing the semiconductor device according to the first embodiment.

Next, as illustrated in FIG. 8, a photosensitive region 122 partially overlapping the photosensitive region 121 is formed, by exposure, in a portion of the photoresist film 101 between the source electrode 32 and the drain electrode 42. The exposure is performed by reduction exposure, for example. When performing the exposure, light 160 is irradiated from the direction perpendicular to the upper surface 10A of the substrate 10. The photosensitive region 122 is formed such that the side surface 152 remains, but the side surface 151 is incorporated into the photosensitive region 122. The photosensitive region 122 has a side surface 161 located at a position closer to the source electrode 32, than the position where the side surface 151 existed is to the source electrode 32. Although the upper surface 10A and the side surface 161 are perpendicular to each other, the side surface 161 may be slightly inclined from the direction perpendicular to the upper surface 10A of the substrate 10 toward the source electrode 32 or the drain electrode 42. An angle formed by the upper surface 10A and the side surface 161 is in a range greater than or equal to 85° and less than or equal to 90°, for example. The photosensitive region 122 has a cross section having a rectangular shape.

A photosensitive region 120 is formed from the photosensitive regions 121 and 122 partially overlapping each other. The photosensitive region 120 has the side surfaces 152 and 161. The photosensitive region 120 has a cross section having a trapezoidal shape with two adjacent apexes forming an angle of 90°, where one of the two adjacent apexes is formed by the side surface 161 and an upper surface of the photosensitive region 122, and the other of the two adjacent apexes is formed by the side surface 161 and a lower surface of the photosensitive region 122.

Figure 9:
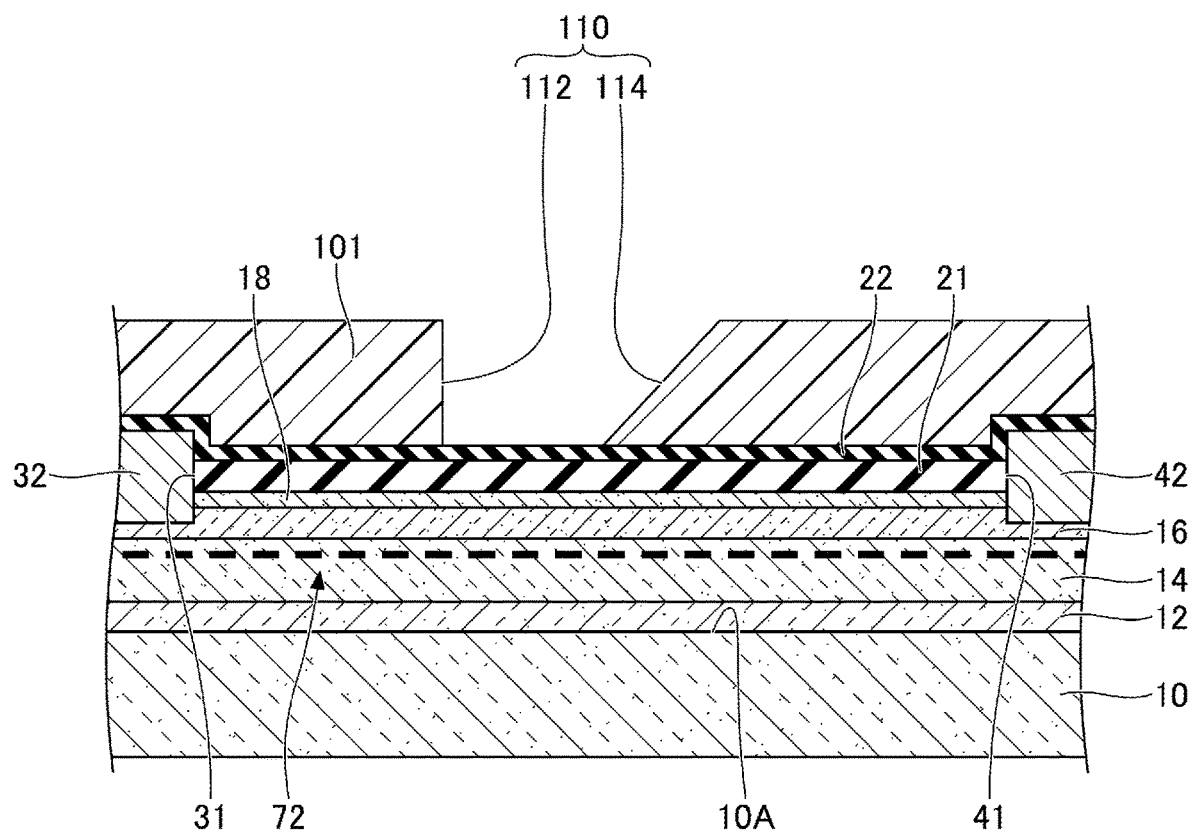
FIG. 9 is a cross sectional view (part 9) illustrating the method for manufacturing the semiconductor device according to the first embodiment.

Next, as illustrated in FIG. 9, the photosensitive region 120 is removed by developing the photoresist film 101. As a result, an opening 110 having side surfaces 112 and 114 is formed in the photoresist film 101. The side surface 112 is formed at the position of the side surface 161 of the photosensitive region 120, and the side surface 114 is formed at the position of the side surface 152 of the photosensitive region 120. Accordingly, the side surface 112 is closer to the source electrode 32 than the side surface 114 is to the source electrode 32. In the opening 110, an angle formed by the side surface 112 on the side of the source electrode 32 and the upper surface 10A of the substrate 10 is larger than an angle formed by the side surface 114 on the side of the drain electrode 42 and the upper surface 10A of the substrate 10. The angle formed by the upper surface 10A and the side surface 112 may be in a range greater than or equal to 85° and less than or equal to 90° for example, and the angle formed by the upper surface 10A and the side surface 114 may be in a range greater than or equal to 45° and less than or equal to 60°, for example. An alkaline developer is used to develop the photoresist film 101, for example. The photoresist film 101 formed with the opening 110 is an example of a mask.

Figure 10:
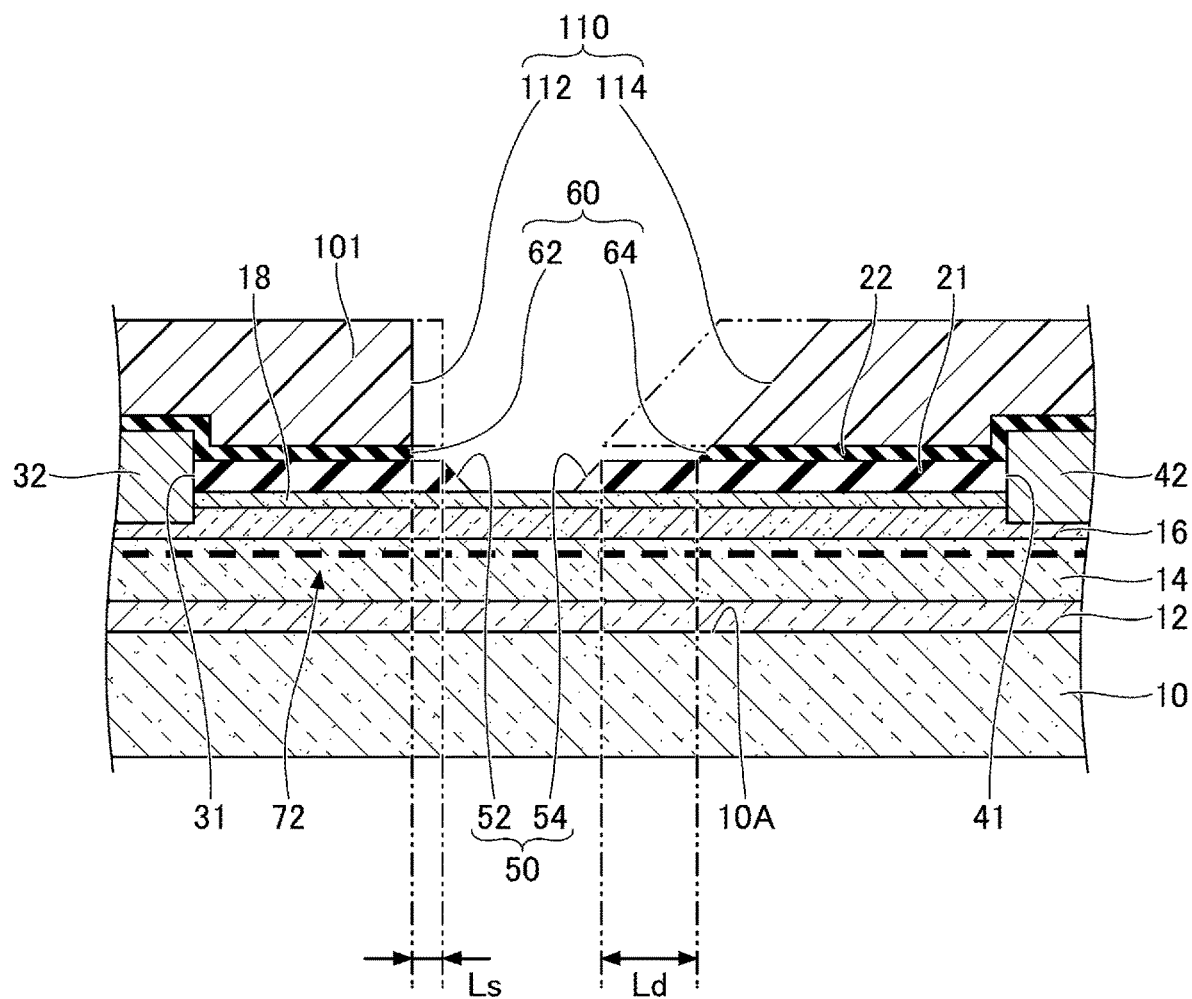
FIG. 10 is a cross sectional view (part 10) illustrating the method for manufacturing the semiconductor device according to the first embodiment.

Next, as illustrated in FIG. 10, the first gate opening 50 is formed in the first insulating film 21, and the second gate opening 60 is formed in the second insulating film 22, by etching the first insulating film 21 and the second insulating film 22 through the opening 110. RIE is used for this etching, for example. The first gate opening 50 has side surfaces 52 and 54 in the cross sectional view. The side surface 52 is located at a position closer to the source electrode 32 than the side surface 54 is to the source electrode 32. The second gate opening 60 has side surfaces 62 and 64 in the cross sectional view. The side surface 62 is located at a position closer to the source electrode 32 than the side surface 64 is to the source electrode 32. A reactive gas including fluorine (F) may be used to etch the first insulating film 21 and the second insulating film 22. This etching is performed under a condition that the etching rate of the second insulating film 22 becomes higher than the etching rate of the first insulating film 21. For example, the etching rate of the second insulating film 22 is set to approximately four times the etching rate of the first insulating film 21. For example, the etching rate of the first insulating film 21 is in a range greater than or equal to 1 nm/minute and less than or equal to 3 nm/minute, and the etching rate of the second insulating film 22 is in a range greater than or equal to 4 nm/minute and less than or equal to 12 nm/minute.

During this etching, the opening 110 of the photoresist film 101 widens while maintaining the shape of the side surfaces 112 and 114. In this state, the side surface 112 is perpendicular to the upper surface 10A, but the side surface 114 is inclined from the side surface 112. For this reason, the side surface 114 is more easily etched than the side surface 112, and a moving amount of the side surface 114 is larger than a moving amount of the side surface 112. In addition, the second gate opening 60 of the second insulating film 22 is formed following the shape of the opening 110. Accordingly, the side surface 62 of the second gate opening 60 becomes continuous with the side surface 112, and the side surface 64 of the second gate opening 60 becomes continuous with the side surface 114. The angle formed by the upper surface 10A and the side surface 62 may be in a range greater than or equal to 85° and less than or equal to 90°, for example, and the angle formed by the upper surface 10A and the side surface 64 may be in a range greater than or equal to 45° and less than or equal to 60°, for example.

On the other hand, because the first insulating film 21 is etched at a rate that is approximately 1/4 that of the second insulating film 22, even when the opening 110 is widened, the first gate opening 50 is hardly affected by the widening of the opening 110. Accordingly, the first gate opening 50 is mainly formed below the portion exposed inside the opening 110 at the start of etching the second insulating film 22. Hence, the side surface 52 of first gate opening 50 becomes discontinuous with the side surface 62, and side surface 54 of first gate opening 50 becomes discontinuous with the side surface 64. The side surfaces 52 and 54 may be a surface perpendicular to the upper surface 10A, or may be a surface inclined from the surface perpendicular to the upper surface 10A.

Because the first gate opening 50 and the second gate opening 60 are formed by such a mechanism, a distance Ls between the side surface 52 of the first gate opening 50 and the side surface 62 of the second gate opening 60 becomes smaller than a distance Ld between the side surface 54 of the first gate opening 50 and the side surface 64 of the second gate opening 60.

Figure 11:
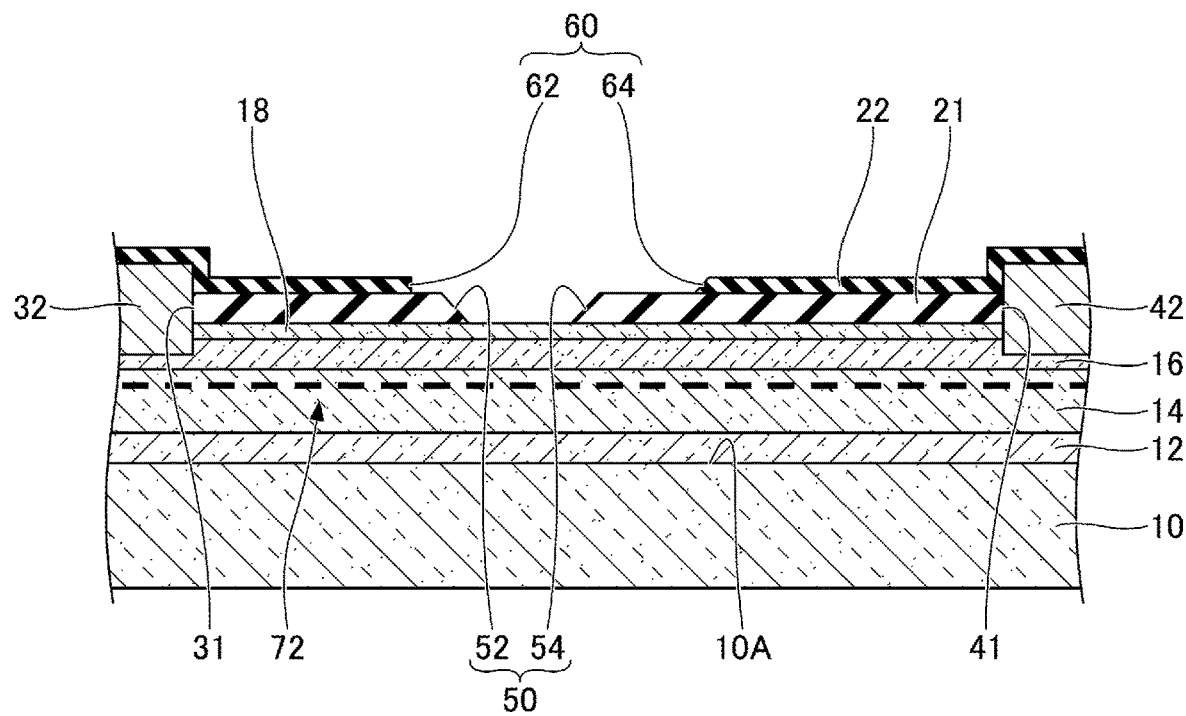
FIG. 11 is a cross sectional view (part 11) illustrating the method for manufacturing the semiconductor device according to the first embodiment.

After forming the first gate opening 50 and the second gate opening 60, the photoresist film 101 is removed as illustrated in FIG. 11. The photoresist film 101 can be removed by using an organic solvent, oxygen plasma, or the like, for example.

Figure 12:
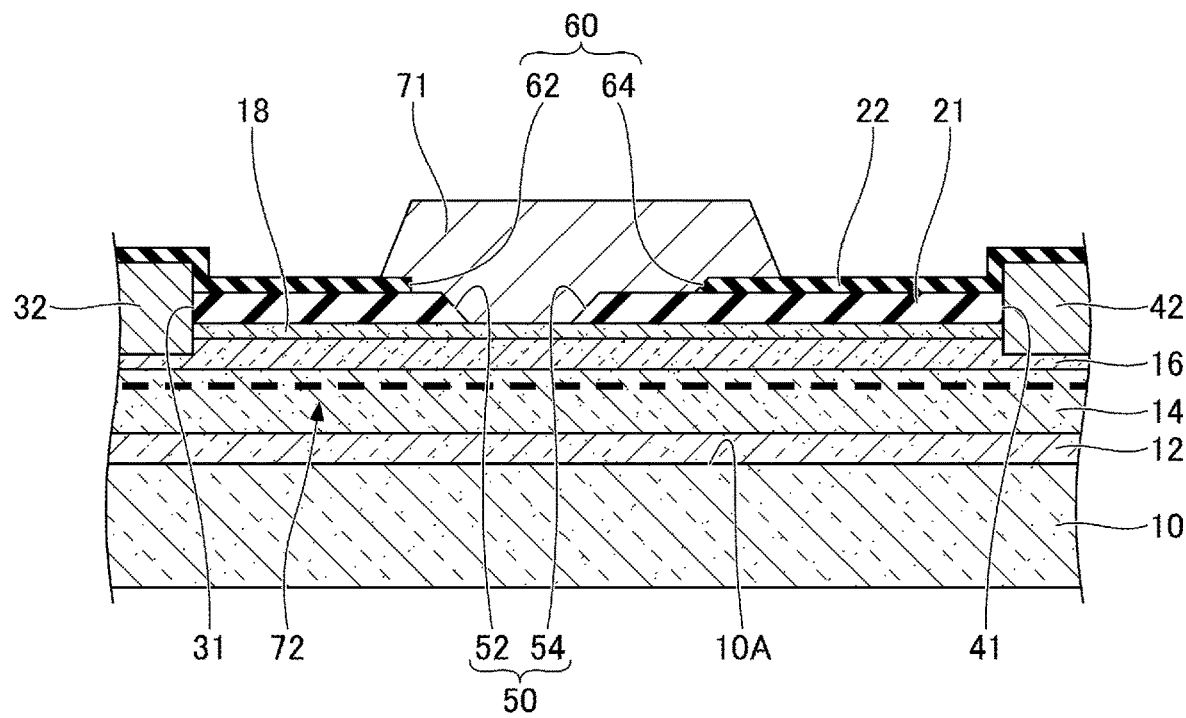
FIG. 12 is a cross sectional view (part 12) illustrating the method for manufacturing the semiconductor device according to the first embodiment.

Next, as illustrated in FIG. 12, a gate electrode 71 is formed on the first insulating film 21 and the second insulating film 22. The gate electrode 71 can be formed by vapor deposition and lift-off, for example. The gate electrode 71 includes a Ni film and a Au film, for example. The gate electrode 71 makes a Schottky contact with the capping layer 18, through the first gate opening 50 and the second gate opening 60.

Figure 13:
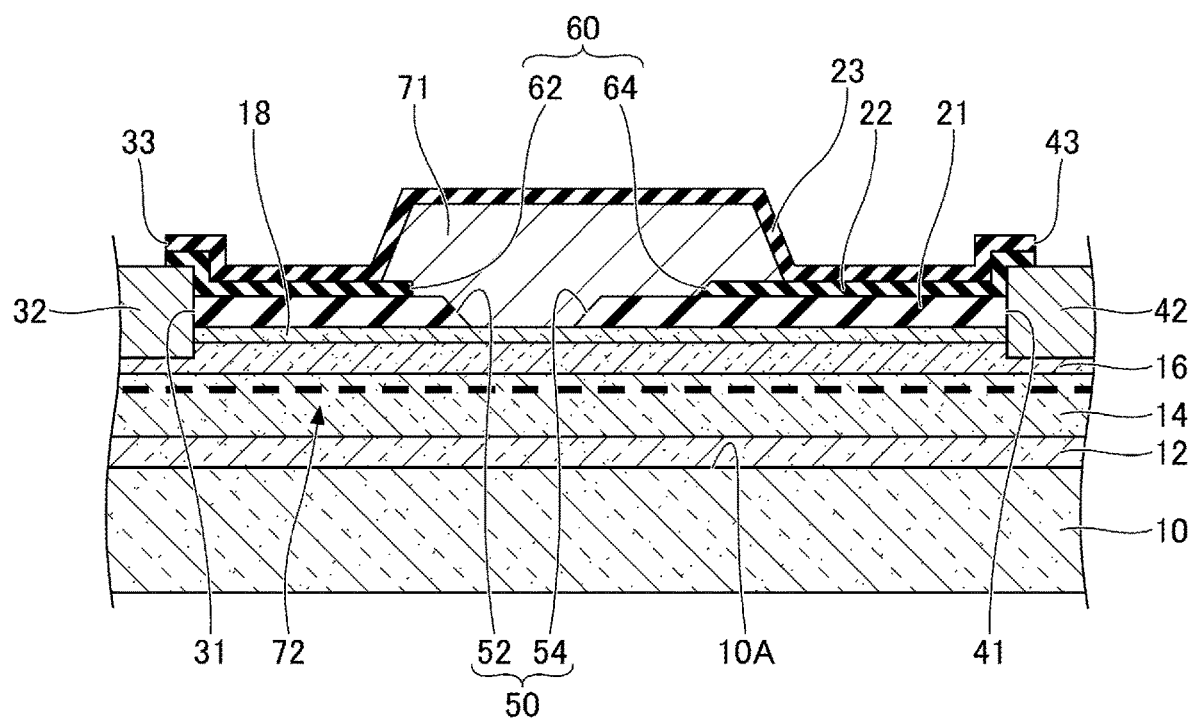
FIG. 13 is a cross sectional view (part 13) illustrating the method for manufacturing the semiconductor device according to the first embodiment.

Next, as illustrated in FIG. 13, a third insulating film 23 covering the gate electrode 71, the source electrode 32, and the drain electrode 42, is formed. The third insulating film 23 is a silicon nitride (SiN) film, for example. The silicon nitride film can be formed by CVD, for example. Next, an opening 33 that exposes a portion of the source electrode 32, and an opening 43 that exposes a portion of the drain electrode 42, are formed in the third insulating film 23 and the second insulating film 22. The openings 33 and 43 are formed by RIE using a resist mask (not illustrated), for example.

Thereafter, interconnects or the like are formed, as required. Hence, the semiconductor device 100 including the GaN-HEMT can be manufactured in the above described manner.

According to the first embodiment, in the opening 110 formed in the photoresist film 101, the angle formed by the side surface 112 on the side of the source electrode 32 and the upper surface 10A of the substrate 10 is larger than the angle formed by the side surface 114 on the side of the drain electrode 42 and the upper surface 10A of the substrate 10. For this reason, as described above, the opening 110 easily widens on the side of the drain electrode 42 during the etching than on the side of the source electrode 32. In addition, during the etching, the etching rate of the second insulating film 22 is higher than the etching rate of the first insulating film 21. Hence, the second gate opening 60 is more easily affected by the shape of the opening 110 than the first gate opening 50. Thus, the portion of the first insulating film 21 exposed from the second insulating film 22 easily widens on the side of the drain electrode 42 than on the side of the source electrode 32. For this reason, the portion of the gate electrode 71 widening on the first insulating film 21 toward the drain electrode 42 can be made larger than the portion of the gate electrode 71 widening on the first insulating film 21 toward the source electrode 32. As a result, it is possible to simultaneously relax the electric field concentration and reduce the increase in electrostatic capacitance.

Moreover, when forming the opening 110, two exposures with different light irradiating directions are performed, and thus, the opening 110 can be easily be formed with a high accuracy. The photosensitive region 120 may be formed by a single exposure using a shifted telecentric optical system, instead of performing the two exposures. It is also possible in this case to easily form the opening 110 with a high accuracy.

When the angle formed by the upper surface 10A and the side surface 112 is in a range greater than or equal to 85° and less than or equal to 90°, and the angle formed by the upper surface 10A and the side surface 114 is in a range greater than or equal to 45° and less than or equal to 60°, the opening 110 in particular easily widens on the side of the drain electrode 42 than on the side of the source electrode 32 during etching. The angle formed by the upper surface 10A and the side surface 112 is more preferably in a range greater than or equal to 87° and less than or equal to 90°, and the angle formed by the upper surface 10A and the side surface 114 is more preferably in a range greater than or equal to 45° and less than or equal to 55°.

In the case where the first insulating film 21 is a first silicon nitride film having a first refractive index (for example, 2.00), and the second insulating film 22 is a second silicon nitride film having a second refractive index (for example, 1.85) lower than the first refractive index, the etching rate of the second insulating film 22 can easily be made higher than the etching rate of the first insulating film 21. The refractive index of the silicon nitride film can be measured using a spectroscopic ellipsometer or a spectroscopic reflectometry film thickness measuring device. Further, the silicon nitride film has wavelength dispersion. The refractive index of the silicon nitride film in the present disclosure is defined as the refractive index at a wavelength of 632.8 nm (HeNe laser).

In the case where the etching rate of the second insulating film 22 is four times or more higher than the etching rate of the first insulating film 21, the portion of the first insulating film 21 exposed from the second insulating film 22 can easily be widened on the side of the drain electrode 42 than on the side of the source electrode 32. More preferably, the etching rate of the second insulating film 22 is five times or more higher than the etching rate of the first insulating film 21.

Second Embodiment

Figure 14:
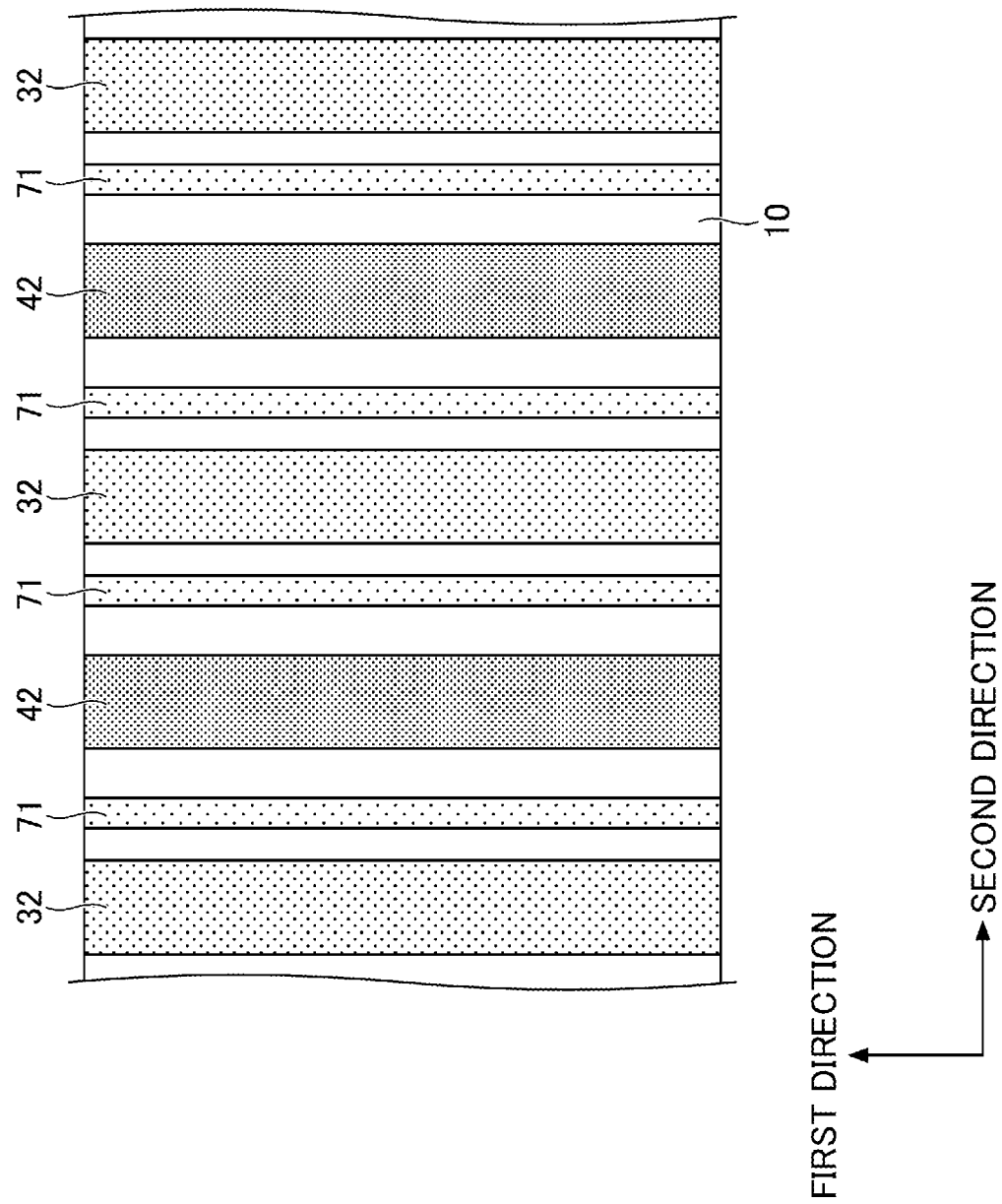
FIG. 14 is a diagram generally illustrating a finger gate structure.

Next, a second embodiment will be described. The second embodiment relates to a method for manufacturing a semiconductor device including a GaN-HEMT having a nitride semiconductor as a main constituent material thereof. The second embodiment is particularly suitable for a GaN-HEMT having a finger gate structure. FIG. 14 is a diagram generally illustrating the finger gate structure. FIG. 15 through FIG. 27 are cross sectional views illustrating the method for manufacturing the semiconductor device according to the second embodiment.

In the finger gate structure, as illustrated in FIG. 14, the gate electrode 71, the source electrode 32, and the drain electrode 42 extend in a first direction parallel to the upper surface of the substrate. In addition, a plurality of source electrodes 32 and drain electrodes 42 are alternately formed in a second direction that is parallel to the upper surface of the substrate and is perpendicular to the first direction. One gate electrode 71 is formed between each pair of the source electrode 32 and the drain electrode 42 that are adjacent to each other in the second direction.

Figure 15:
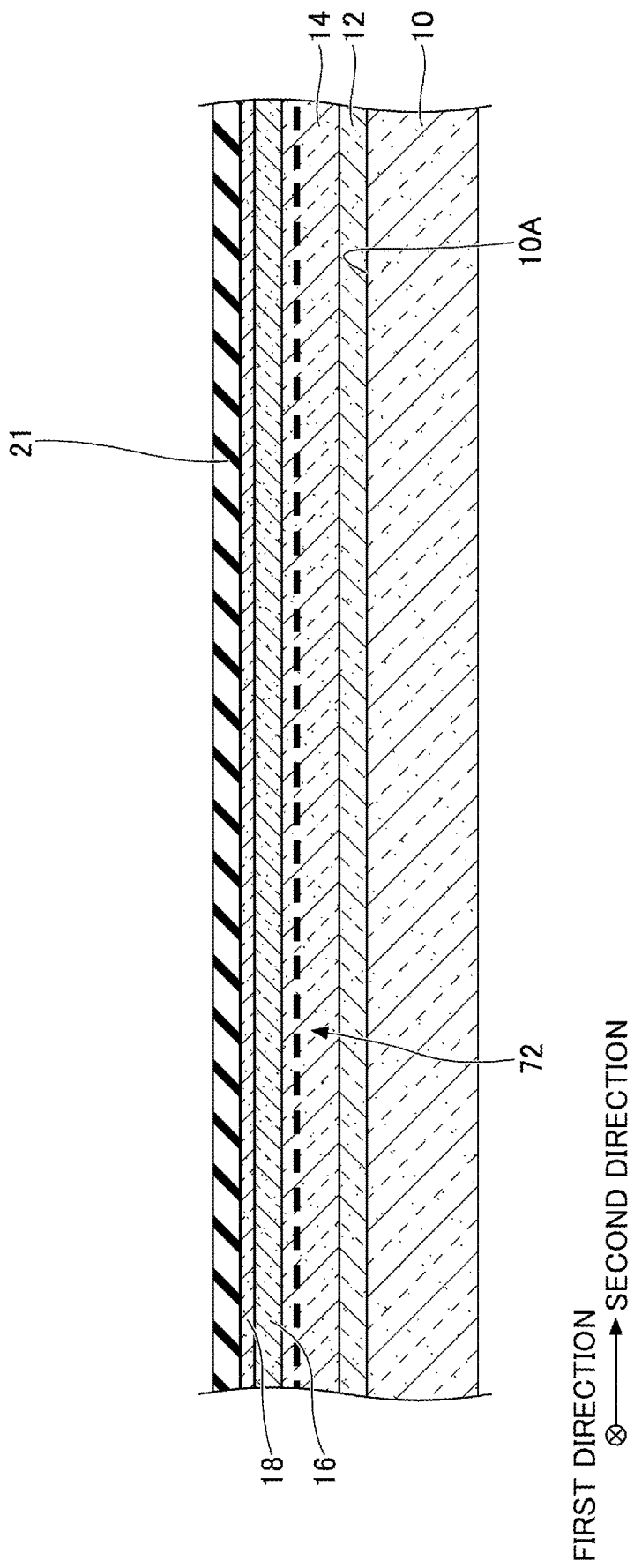
FIG. 15 is a cross sectional view (part 1) illustrating the method for manufacturing the semiconductor device according to a second embodiment.

First, in the second embodiment, the buffer layer 12, the electron transit layer 14, the electron supply layer 16, and the capping layer 18 are successively formed on the substrate 10, as illustrated in FIG. 15, similar to the first embodiment. Next, the first insulating film 21 is formed on the capping layer 18.

Figure 16:
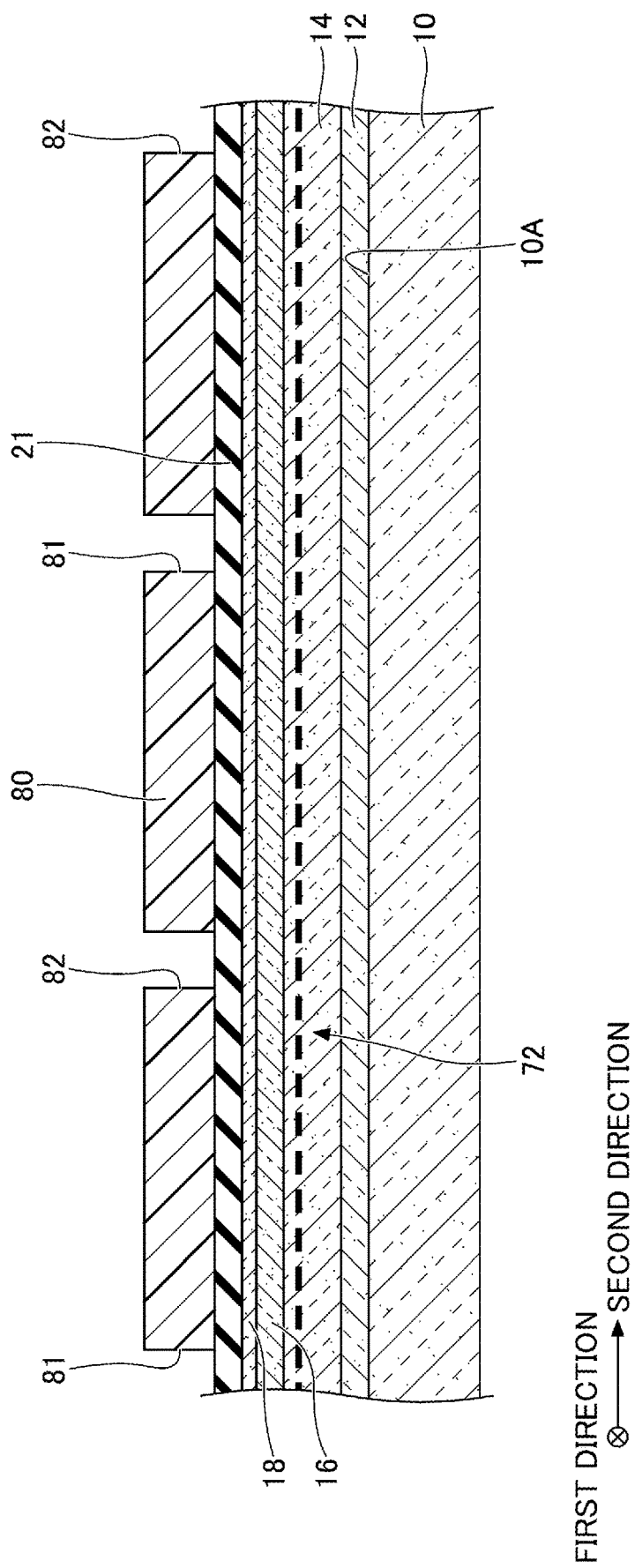
FIG. 16 is a cross sectional view (part 2) illustrating the method for manufacturing the semiconductor device according to the second embodiment.

Next, as illustrated in FIG. 16, a resist mask 80 is formed on the first insulating film 21. The resist mask 80 has a plurality of openings 81, and a plurality of openings 82. The openings 81 and the openings 82 are alternately arranged in the second direction.

Figure 17:
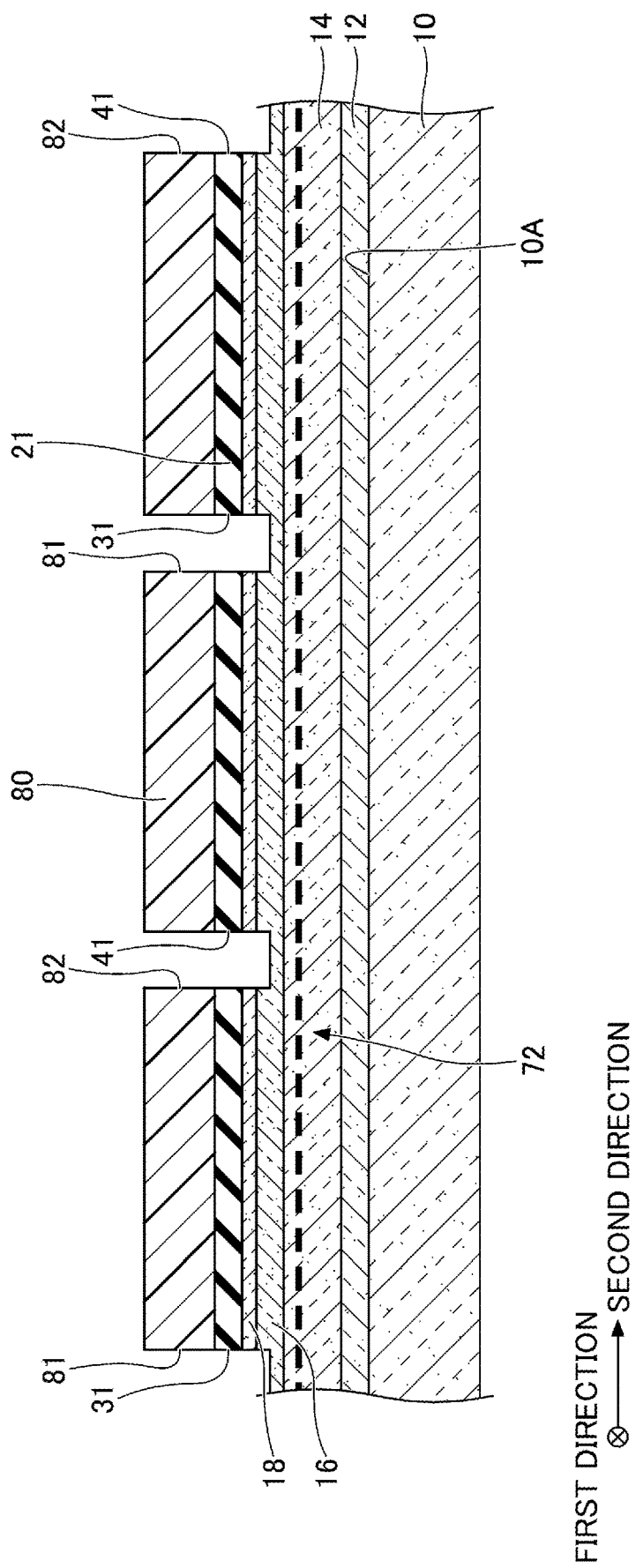
FIG. 17 is a cross sectional view (part 3) illustrating the method for manufacturing the semiconductor device according to the second embodiment.

Next, as illustrated in FIG. 17, the openings 31 and 41 are formed in the first insulating film 21, the capping layer 18, and the electron supply layer 16 by RIE, similar to the first embodiment. In this state, the openings 31 and 41 are formed to extend in the first direction parallel to the upper surface 10A of the substrate 10. In addition, the plurality of openings 31 and 41 are alternately formed in the second direction that is parallel to the upper surface 10A and is perpendicular to the first direction.

Figure 18:
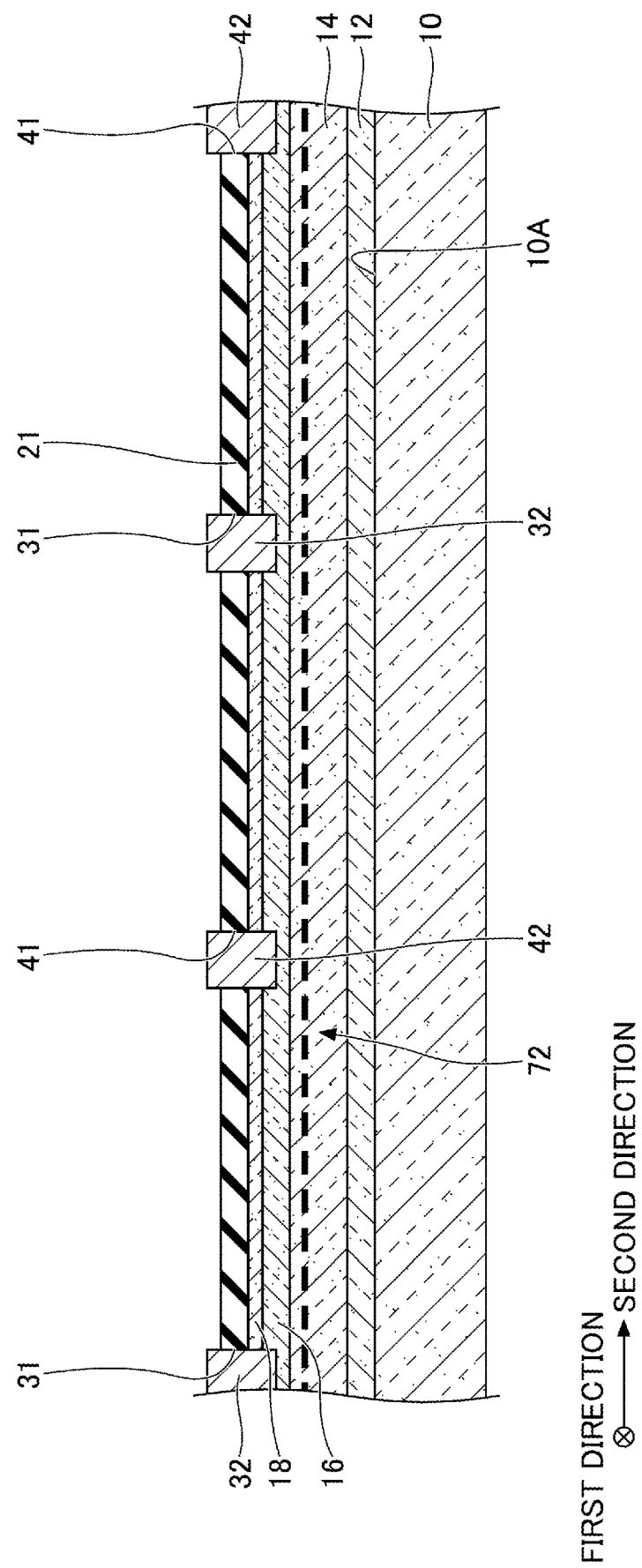
FIG. 18 is a cross sectional view (part 4) illustrating the method for manufacturing the semiconductor device according to the second embodiment.

Next, as illustrated in FIG. 18, the source electrode 32 is formed inside the opening 31, and the drain electrode 42 is formed inside the opening 41, similar to the first embodiment. In this state, the source electrode 32 and the drain electrode 42 are formed to extend in the first direction. In addition, the plurality of source electrodes 32 and the plurality of drain electrodes 42 are alternately formed in the second direction.

Figure 19:
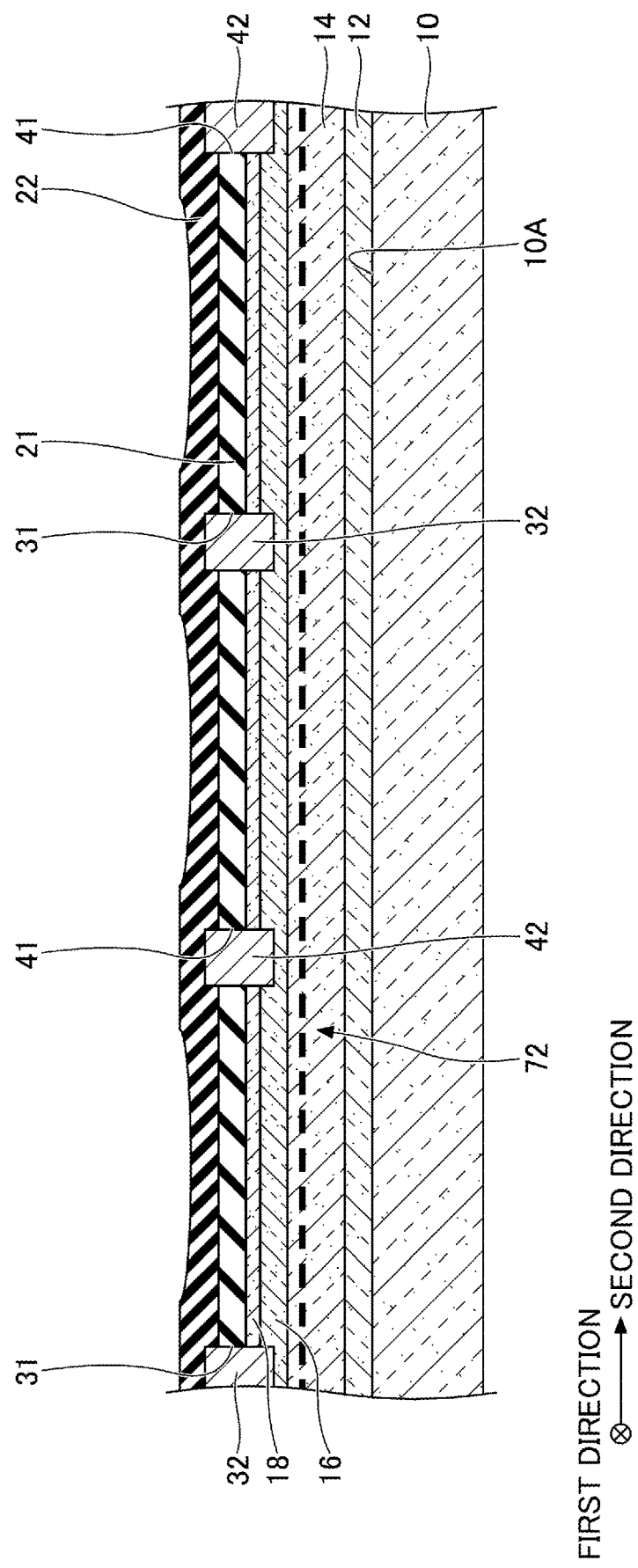
FIG. 19 is a sectional view (part 5) illustrating the method for manufacturing the semiconductor device according to the second embodiment.

Next, as illustrated in FIG. 19, the second insulating film 22 is formed on the first insulating film 21, the source electrode 32, and the drain electrode 42, similar to the first embodiment.

Figure 20:
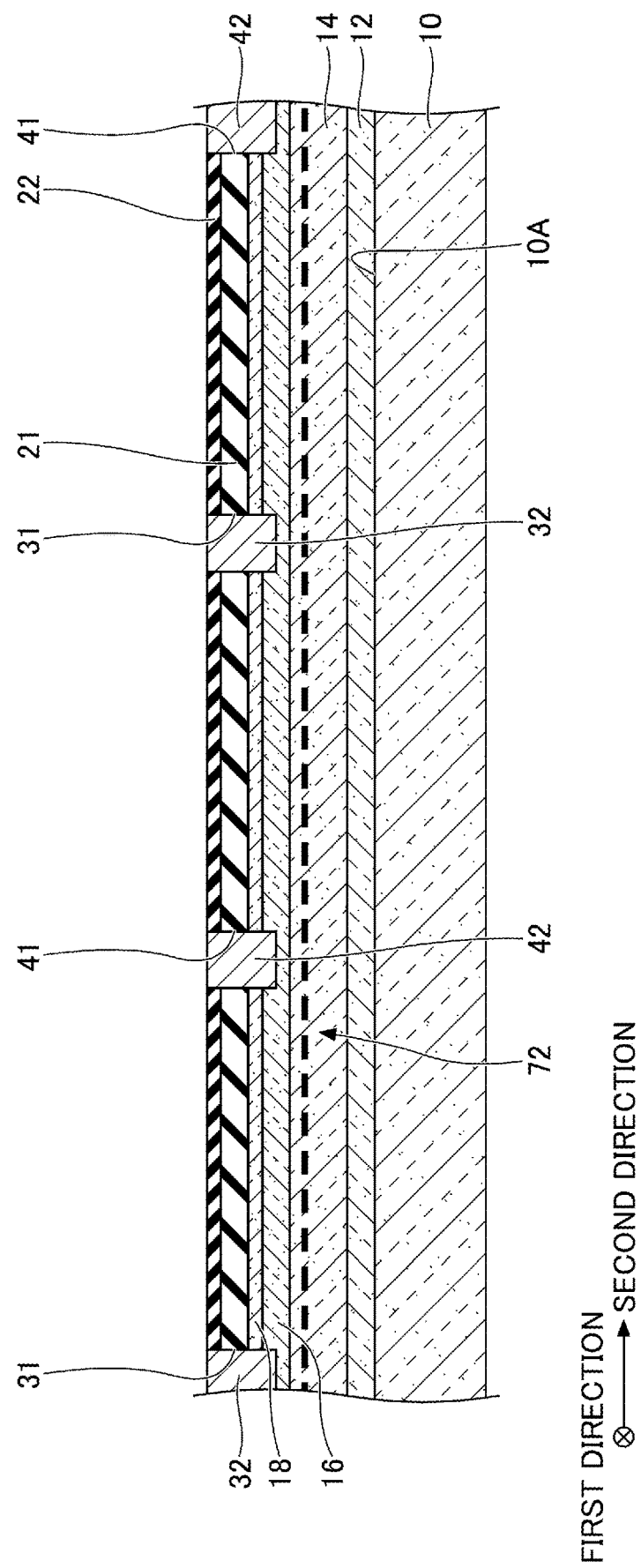
FIG. 20 is a cross sectional view (part 6) illustrating the method for manufacturing the semiconductor device according to the second embodiment.

Next, as illustrated in FIG. 20, an upper surface of the second insulating film 22 is planarized. The upper surface of the second insulating film 22, an upper surface of the source electrode 32, and an upper surface of the drain electrode 42 may coincide with one another. For example, the second insulating film 22 is polished until the upper surface of the source electrode 32 and the upper surface of the drain electrode 42 become exposed. For example, chemical mechanical polishing (CMP) may be performed as the polishing of the second insulating film 22. The source electrode 32 and the drain electrode 42 may also be polished.

Figure 21:
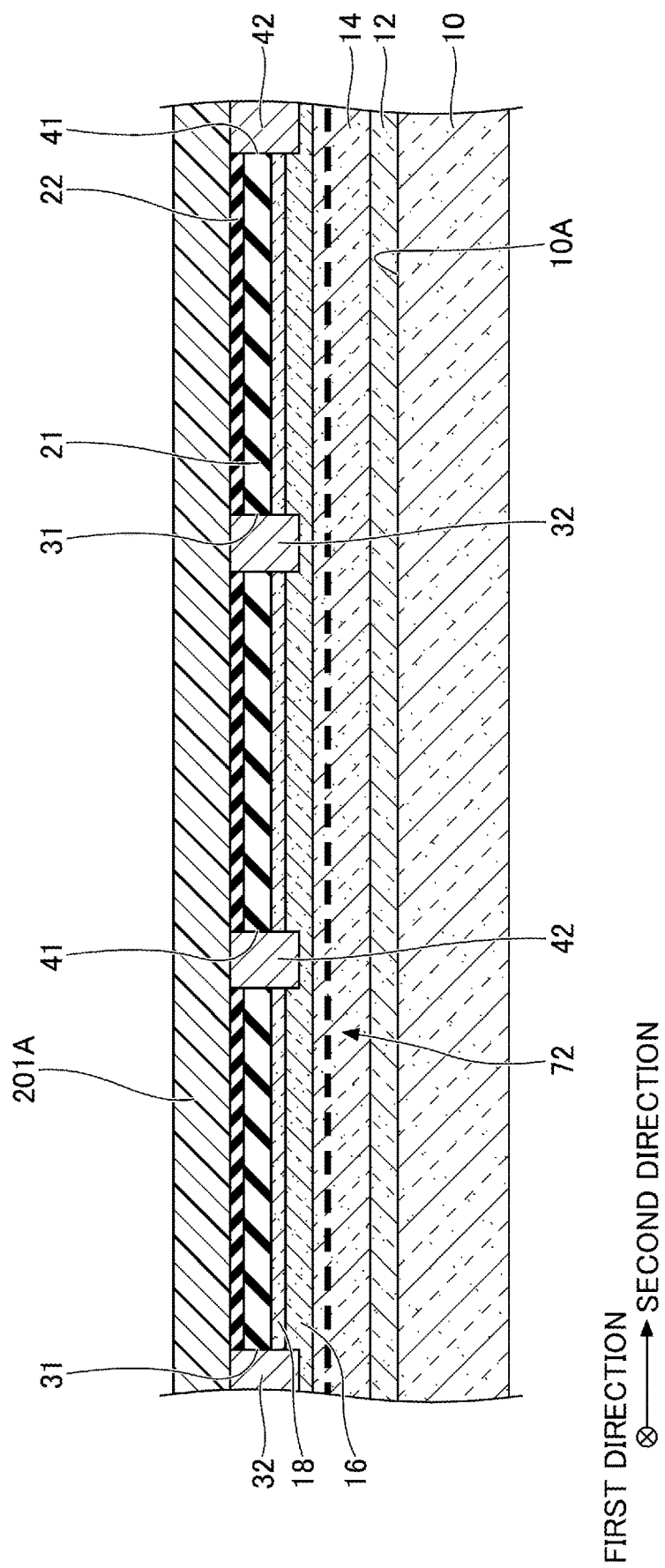
FIG. 21 is a sectional view (part 7) illustrating the method for manufacturing the semiconductor device according to the second embodiment.

Next, as illustrated in FIG. 21, an uncured film 201A of an ultraviolet (UV) curable resin is formed on the second insulating film 22.

Figure 22:
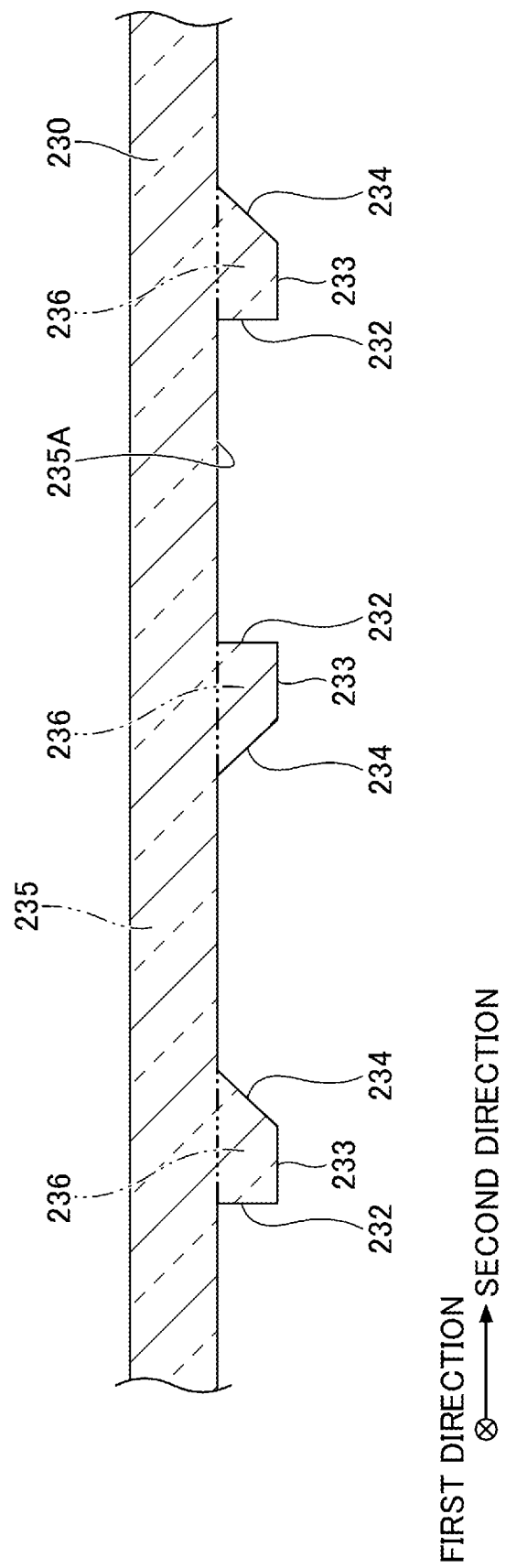
FIG. 22 is a cross sectional view (part 8) depicting the method for manufacturing the semiconductor device according to the second embodiment.

Further, as illustrated in FIG. 22, a mold 230 that transmits ultraviolet light is prepared. The mold 230 includes a flat base 235, and a plurality of protrusions 236 protruding from the base 235. The protrusions 236 protrude from one surface 235A of the base 235, that is, from a lower surface of the base 235, for example. The protrusions 236 extend in the first direction, and are arranged side by side in the second direction. The protrusions 236 are provided to form openings corresponding to the openings 110 of the first embodiment, in a mask to be formed from the uncured film 201A. The protrusion 236 has a surface 233 parallel to the surface 235A, a side surface 232, and a side surface 234. The side surface 232 is perpendicular to the surfaces 233 and 235A, and joins the surface 233 and the surface 235A. The side surface 234 is inclined from the side surface 232, and joins the surface 233 and the surface 235A. The side surfaces 232 and 234 are alternately arranged in the second direction for each of the protrusions 236. There are two kinds of inclination directions of the side surface 234. The mold 230 is a quartz mold, for example. A method for forming the mold 230 will be described later.

Figure 23:
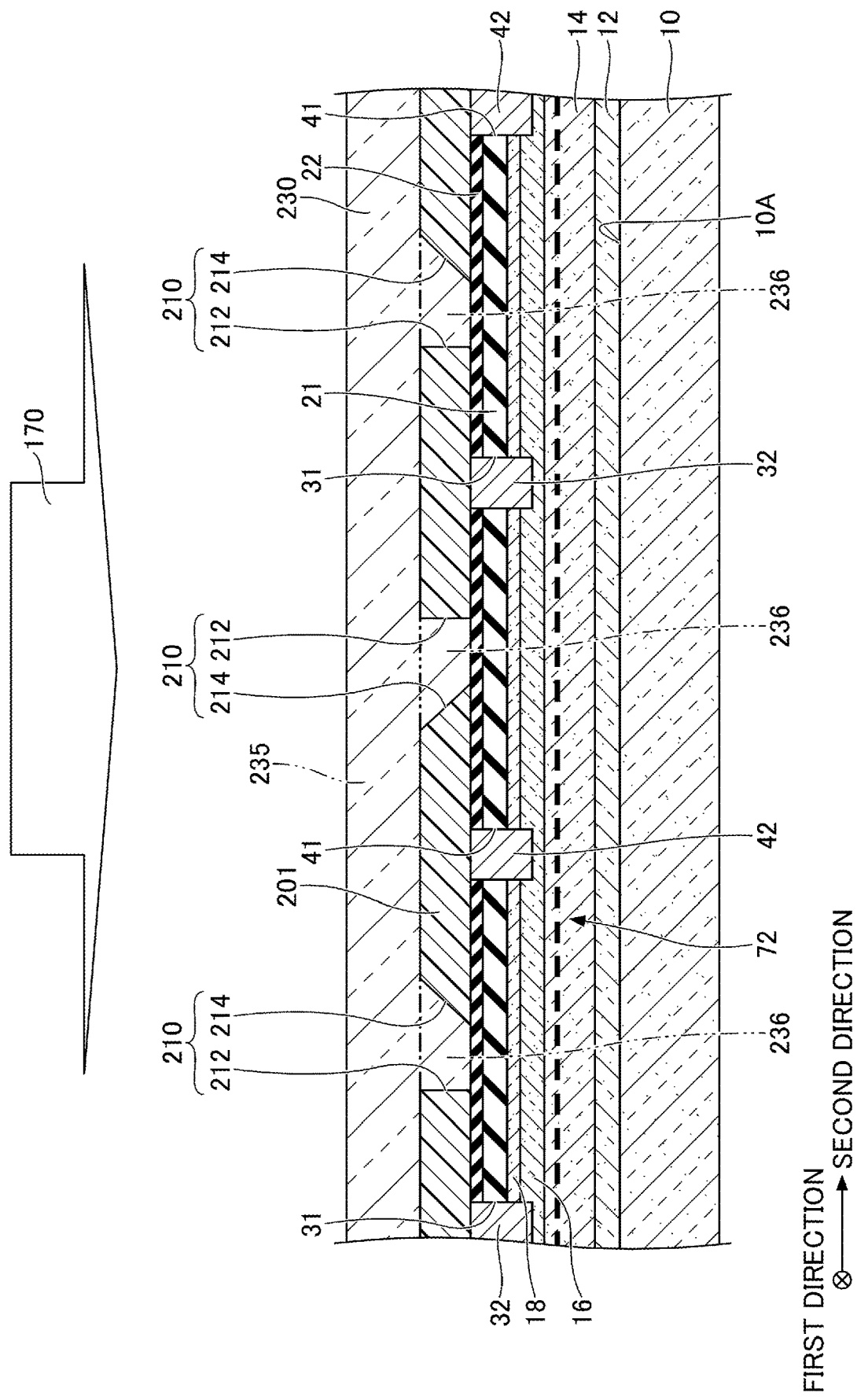
FIG. 23 is a cross sectional view (part 9) illustrating the method for manufacturing the semiconductor device according to the second embodiment.

After forming the uncured film 201A, the mold 230 is pressed against the uncured film 201A, as illustrated in FIG. 23. Then, ultraviolet light 170 is irradiated on the uncured film 201A through the mold 230. As a result, a cured film 201 of the UV curable resin is formed. The cured film 201 of the UV curable resin has an opening 210 with side surfaces 212 and 214. The side surface 212 is formed at the position of the side surface 232 of the protrusion 236, and the side surface 214 is formed at the position of the side surface 234 of the protrusion 236. The side surface 212 is located at a position closer to the source electrode 32 than the side surface 214 is to the source electrode 32. In the opening 210, an angle formed by the side surface 212 on the side of the source electrode 32 and the upper surface 10A of the substrate 10 is larger than an angle formed by the side surface 214 on the side of the drain electrode 42 and the upper surface 10A of the substrate 10. The angle formed by the upper surface 10A and the side surface 212 may be in a range greater than or equal to 85° and less than or equal to 90°, for example, and the angle formed by the upper surface 10A and the side surface 214 may be in a range greater than or equal to 45° and less than or equal to 60°, for example.

Figure 24:
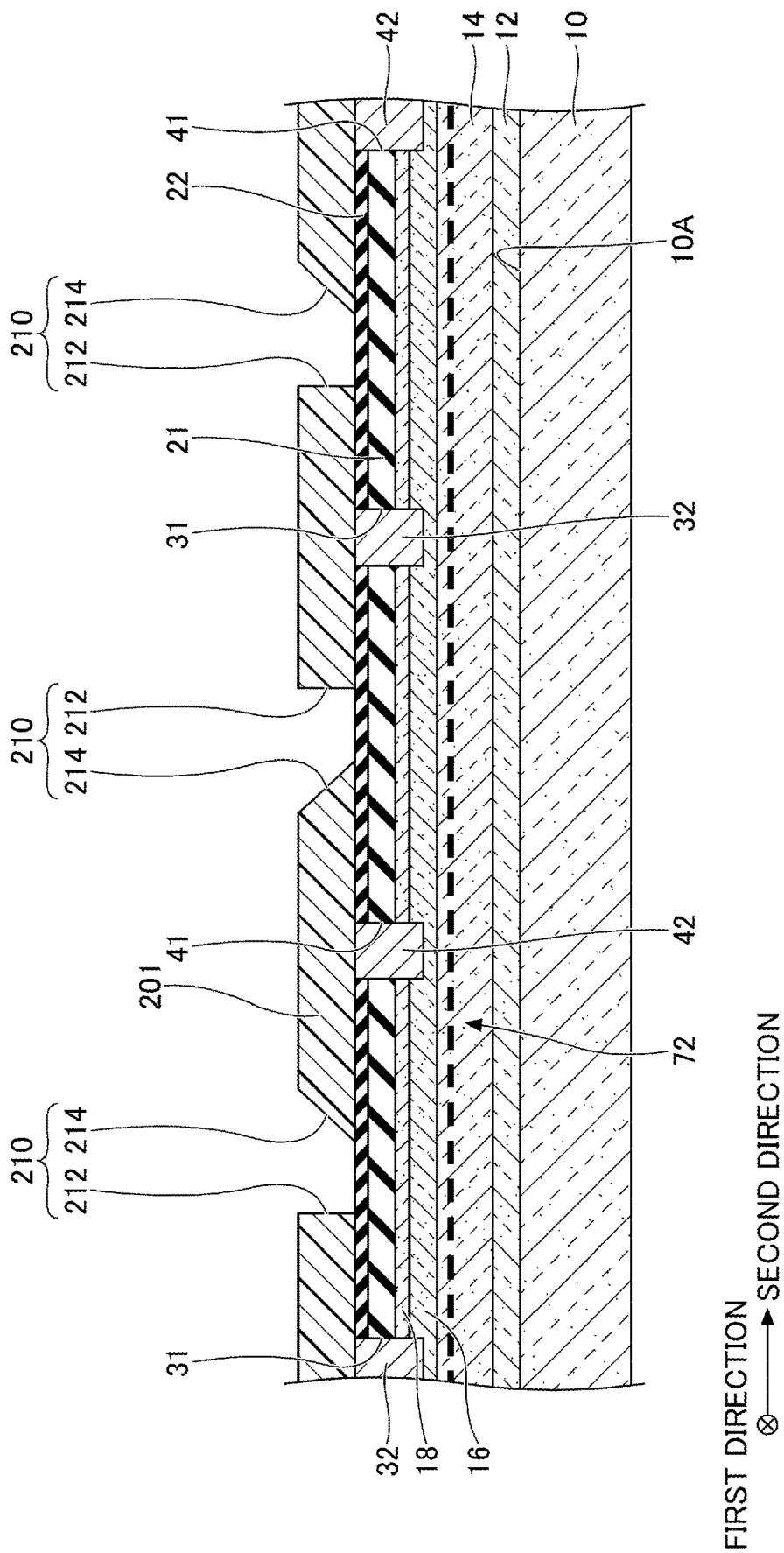
FIG. 24 is a cross sectional view (part 10) illustrating the method for manufacturing the semiconductor device according to the second embodiment.

Next, as illustrated in FIG. 24, the mold 230 is removed. The cured film 201 of the UV curable resin, after the mold 230 is removed, is an example of the mask. A residual film treatment (or removal) is preferably performed after removing the mold 230. The protrusions 236 and the second insulating film 22 may inevitably not make close contact with one another, thereby causing a residual UV curable resin to remain at a bottom of the opening 210. But even if the residual UV curable resin is present, the residual UV curable resin can be removed by the residual film treatment. The residual film treatment irradiates oxygen plasma, for example.

Figure 25:
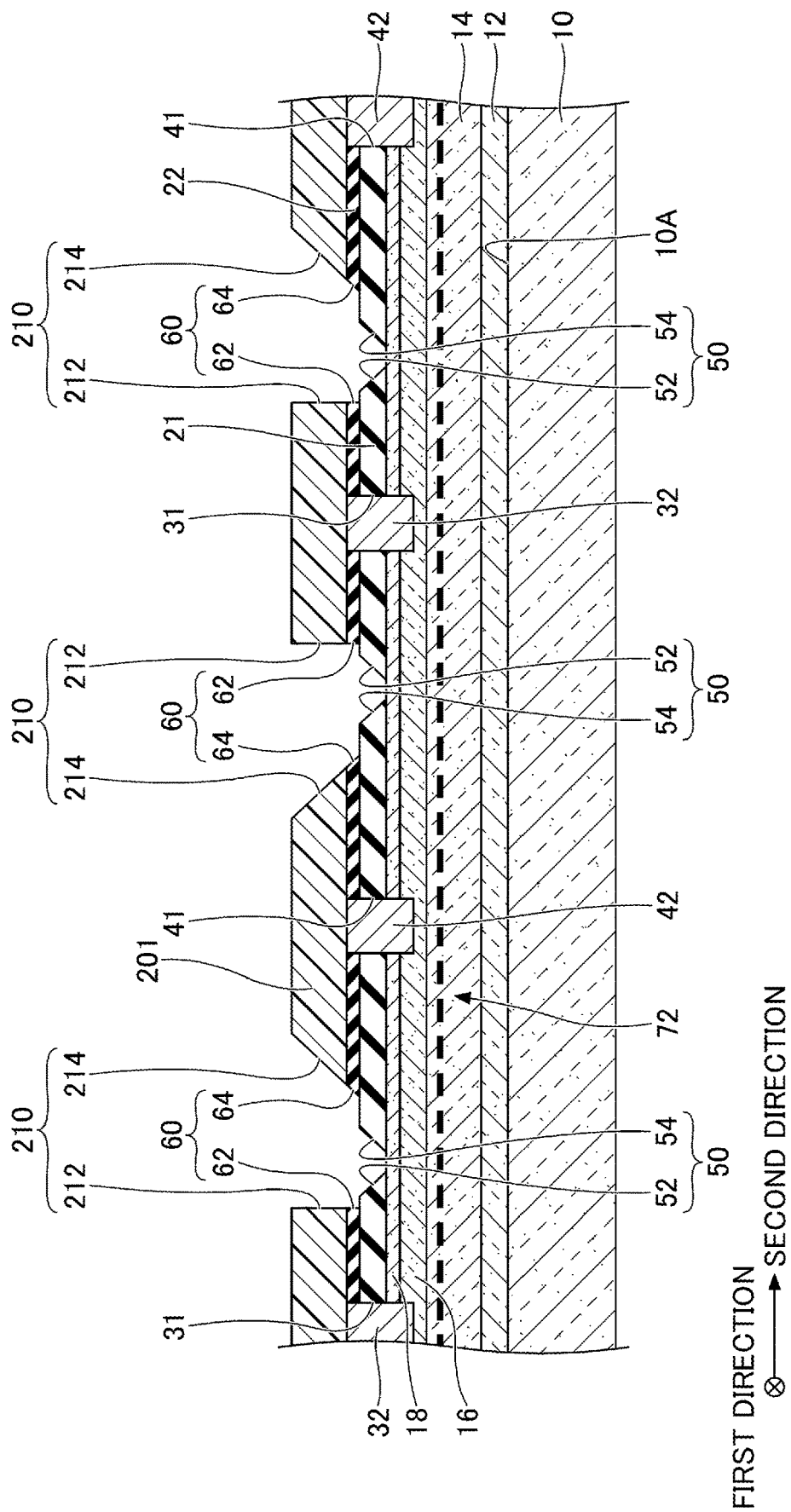
FIG. 25 is a cross sectional view (part 11) depicting the method for manufacturing the semiconductor device according to the second embodiment.

Next, as illustrated in FIG. 25, the second gate opening 60 is formed in the second insulating film 22, and the first gate opening 50 is formed in the first insulating film 21 by RIE, similar to the first embodiment. The distance between the side surface 52 of the first gate opening 50 and the side surface 62 of the second gate opening 60 becomes smaller than the distance between the side surface 54 of the first gate opening 50 and the side surface 64 of the second gate opening 60, similar to the first embodiment.

Figure 26:
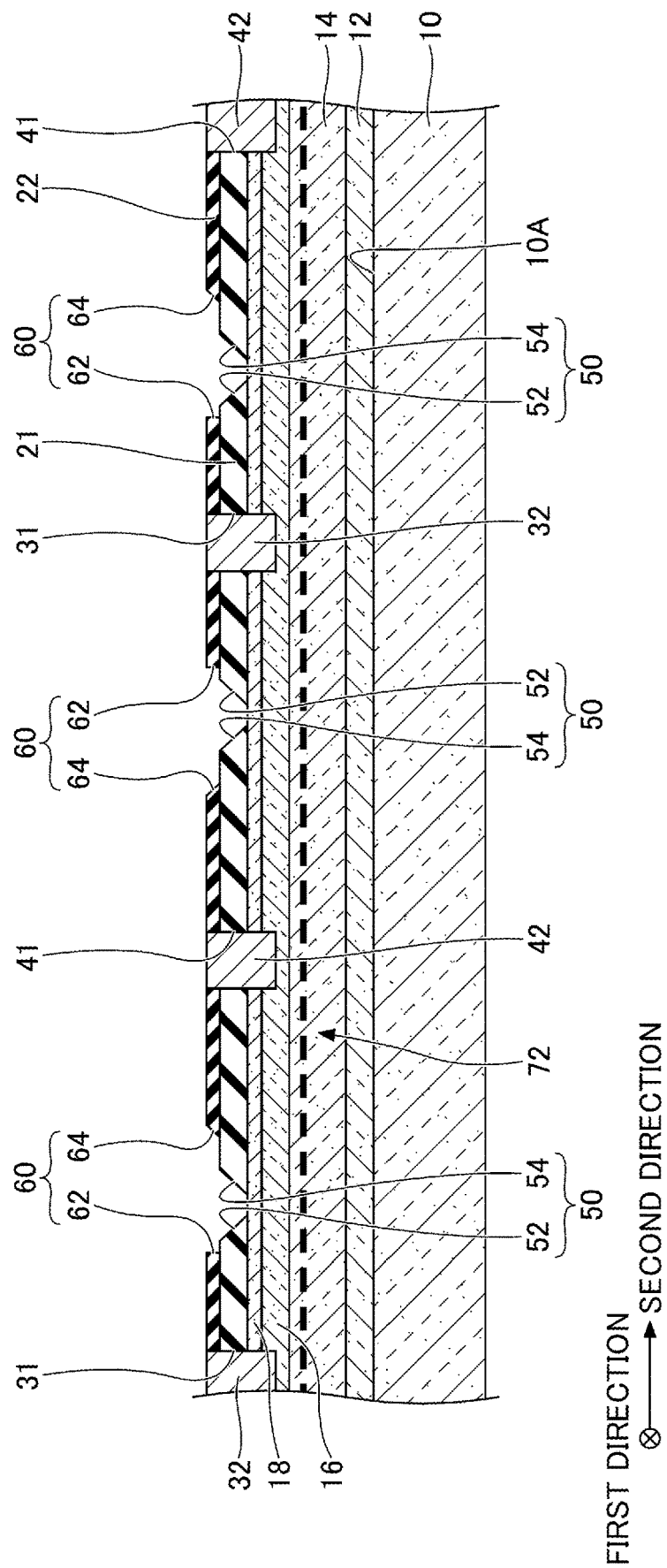
FIG. 26 is a cross sectional view (part 12) illustrating the method for manufacturing the semiconductor device according to the second embodiment.

Next, as illustrated in FIG. 26, the cured film 201 of the UV curable resin is removed. The cured film 201 of the UV curable resin can be removed using an organic solvent, oxygen plasma, or the like, for example.

Figure 27:
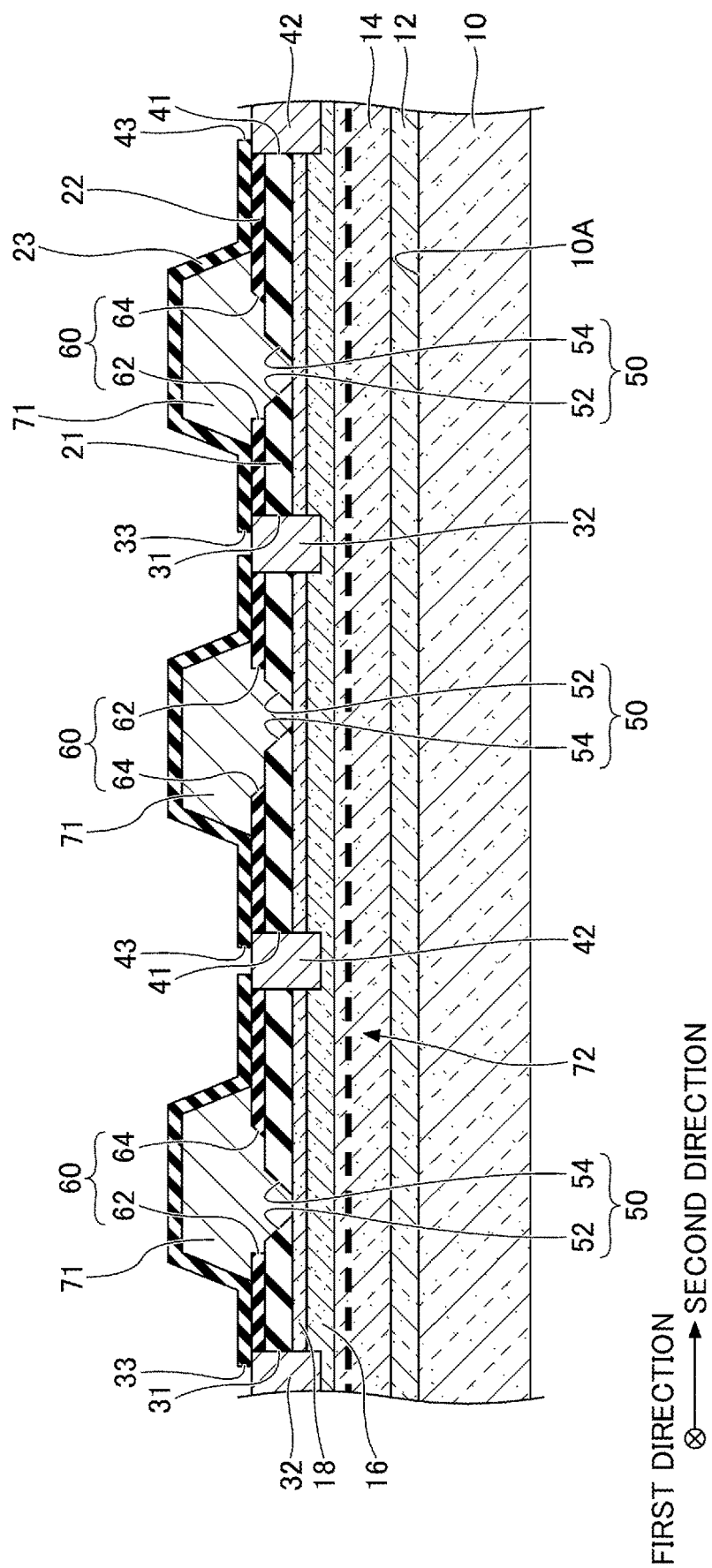
FIG. 27 is a cross sectional view (part 13) illustrating the method for manufacturing the semiconductor device according to the second embodiment.

Next, as illustrated in FIG. 27, the gate electrode 71 is formed on the first insulating film 21 and the second insulating film 22, the third insulating film 23 is formed to cover the gate electrode 71, the source electrode 32, and the drain electrode 42, and the openings 33 and 43 are formed in the third insulating film 23, similar to the first embodiment.

Thereafter, interconnections or the like are formed, as required. Hence, the semiconductor device 200 including the GaN-HEMT can be manufactured in the above described manner.

According to the second embodiment, it is possible to simultaneously relax the electric field concentration and reduce the increase in the electrostatic capacitance, similar to the first embodiment. In addition, because the UV light is irradiated while the mold 230 is pressed against the uncured film 201A of the UV curable resin, the opening 210 can be easily formed with a high accuracy.

The semiconductor device 200 including the GaN-HEMT having the finger gate structure can also be manufactured by performing three exposures with respect to the photoresist film 101, in a modification of the first embodiment. That is, the semiconductor device 200 can be manufactured by adding one exposure for forming the side surface 214 having a different inclination direction.

On the other hand, in the second embodiment, the opening 210 can be formed by a single irradiation of the UV light, using the mold 230. Hence, according to the second embodiment, the GaN-HEMT having the finger gate structure can be easily formed by a small number of processes or steps. The method for forming the opening 210 as in the second embodiment may sometimes be referred to as a UV nano-imprint lithography method.

Next, an example of a method for forming the mold 230 will be described. FIG. 28 through FIG. 34 are cross sectional views illustrating a first example of the method for forming the mold 230. In this example, the mold 230 is formed from quartz.

Figure 28:
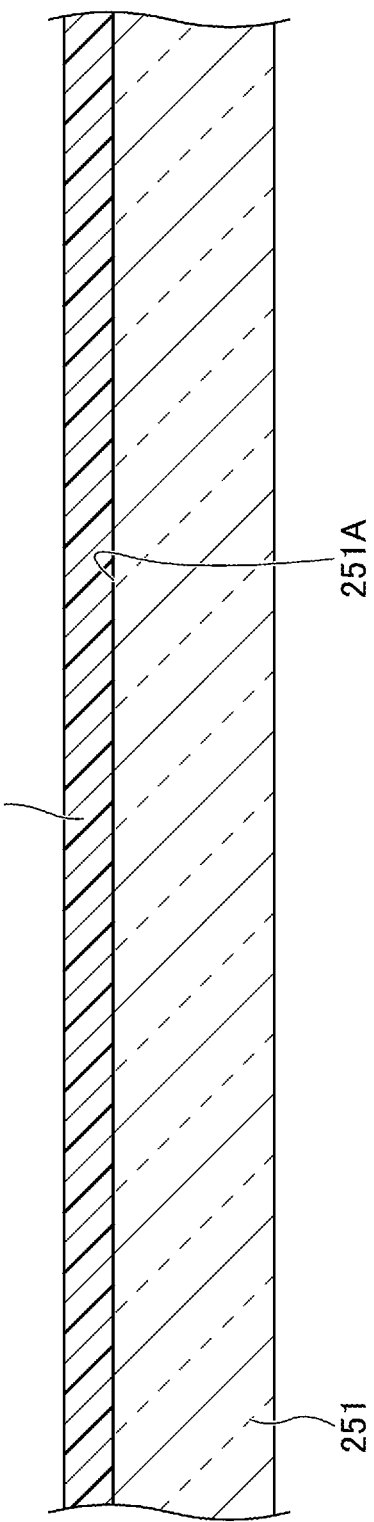
FIG. 28 is a cross sectional view (part 1) illustrating a first example of a mold forming method.

First, as illustrated in FIG. 28, a flat quartz plate 251 is prepared, and a positive photoresist film 252 is formed on one surface 251A of the quartz plate 251.

Figure 29:
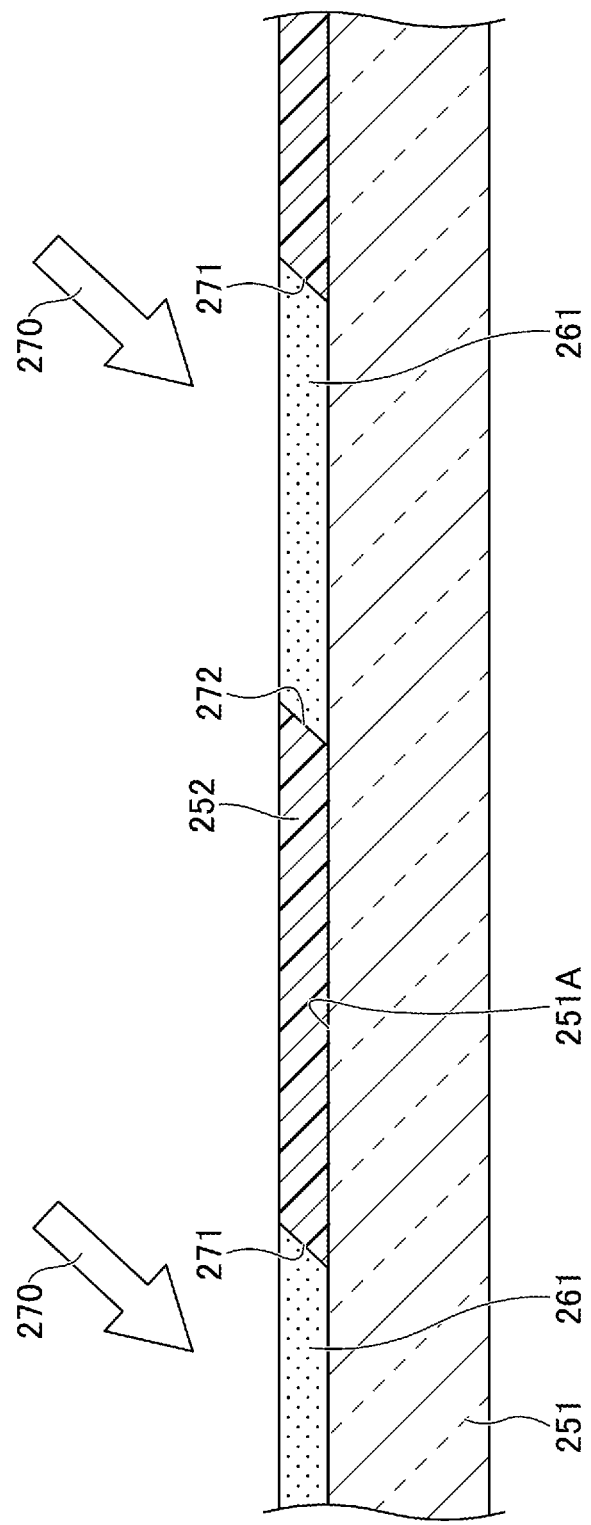
FIG. 29 is a cross sectional view (part 2) illustrating the first example of the mold forming method.

Next, as illustrated in FIG. 29, a photosensitive region 261 is formed in the photoresist film 252 by exposure. The exposure is performed by reduction exposure, for example. When performing the exposure, light 270 is irradiated from a direction inclined from a direction perpendicular to a surface 251A of the quartz plate 251. The photosensitive region 261 has side surfaces 271 and 272 that are parallel to each other in the cross sectional view. As described above, there are two kinds of inclination directions of the side surface 234 of the protrusion 236. The side surface 271 is formed to correspond to the side surface 234 having one of the two kinds of inclinations. The side surface 272 is formed at a position closer to the side surface 271 than the side surface 234 having the other of the two kinds of inclinations is to the side surface 271.

Figure 30:
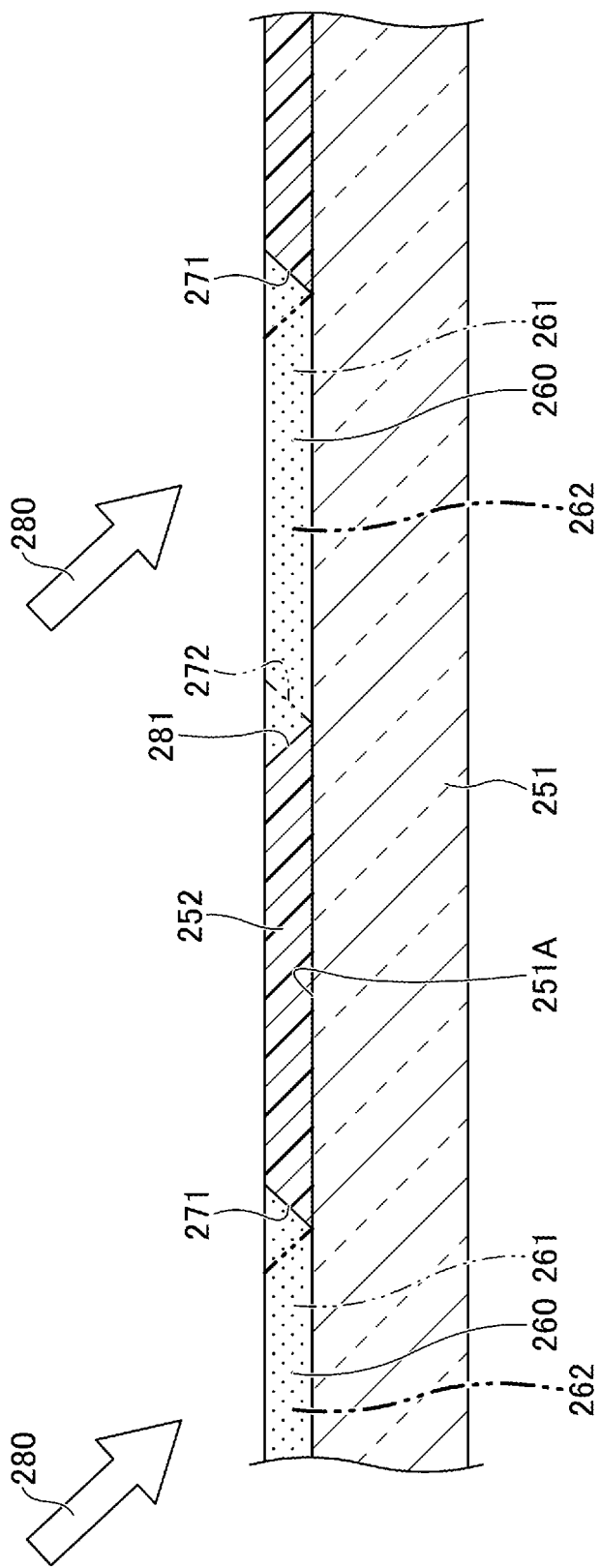
FIG. 30 is a cross sectional view (part 3) illustrating the first example of the mold forming method.

Next, as illustrated in FIG. 30, a photosensitive region 262 partially overlapping the photosensitive region 261 is formed in the photoresist film 252 by exposure. The exposure is performed by reduction exposure, for example. When performing the exposure, light 280 is irradiated from a direction inclined from the direction perpendicular to the surface 251A of the quartz plate 251 in a direction opposite to the direction in which the light 270 is inclined. The photosensitive region 262 is formed such that the side surface 271 remains, but the side surface 272 is incorporated into the photosensitive region 262. The photosensitive region 262 has a side surface 281 located at a position on an outer side of the photosensitive region 261 than the position where the side surface 272 existed. The side surface 281 is formed so as to correspond to the side surface 234 having the other of the two kinds of inclinations.

A photosensitive region 260 is formed from the photosensitive regions 261 and 262 partially overlapping each other. The photosensitive region 260 has side surfaces 271 and 281. The photosensitive region 260 has a cross section having an isosceles trapezoid shape.

Figure 31:
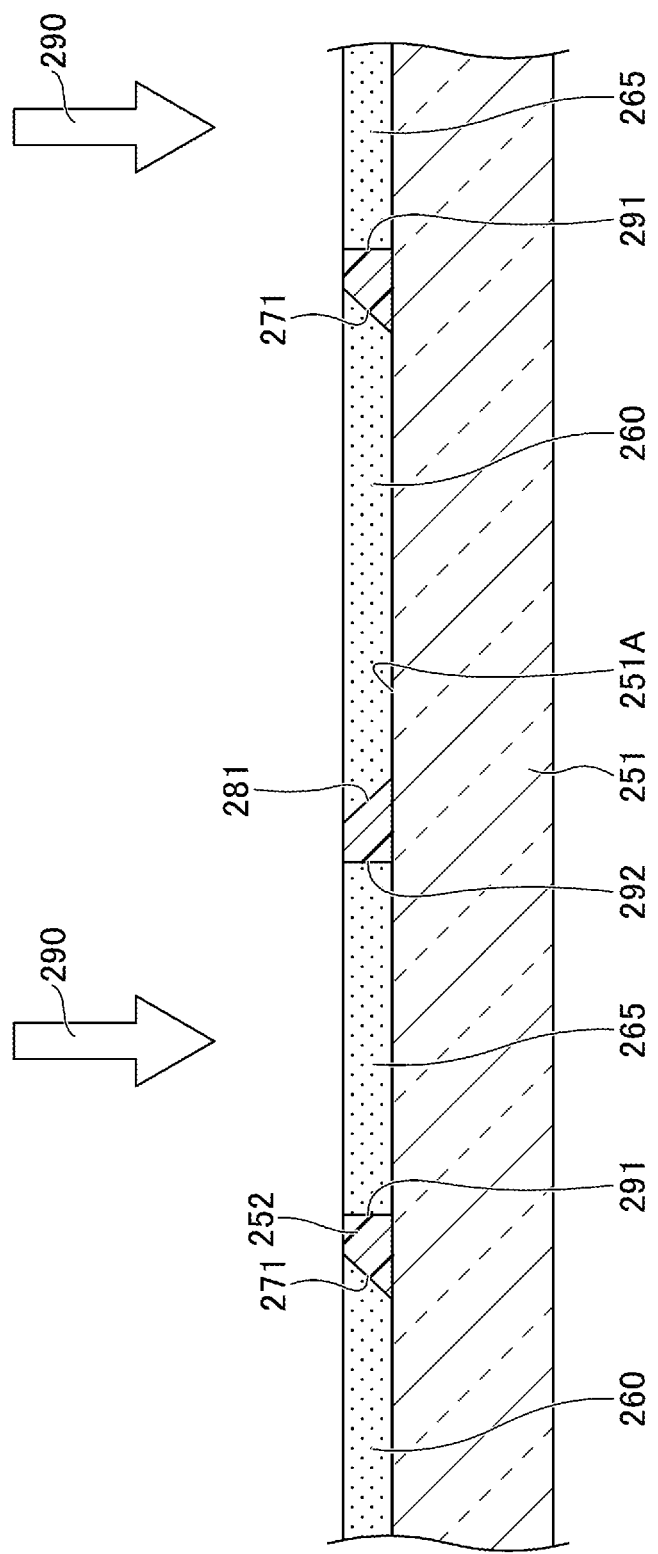
FIG. 31 is a cross sectional view (part 4) illustrating the first example of the mold forming method.

Next, as illustrated in FIG. 31, a photosensitive region 265 is formed in a portion between mutually adjacent photosensitive regions 260 of the photoresist film 252 by exposure. The exposure is performed by reduction exposure, for example. When performing the exposure, light 290 is irradiated from a direction perpendicular to the surface 251A of the quartz plate 251. The photosensitive region 265 has side surfaces 291 and 292 that are parallel to each other in the cross sectional view. The side surfaces 291 and 292 are perpendicular to surface 251A. The side surfaces 291 and 292 are formed to correspond to the side surfaces 232 of the protrusions 236. For example, the side surface 291 is formed so that an unexposed region of the photoresist film 252 remains between the side surface and the side surface 271, and the side surface 292 is formed so that an unexposed region of the photoresist film 252 remains between the side surface 281 and the side surface 292. The photosensitive region 265 has a cross section having a rectangular shape.

Figure 32:
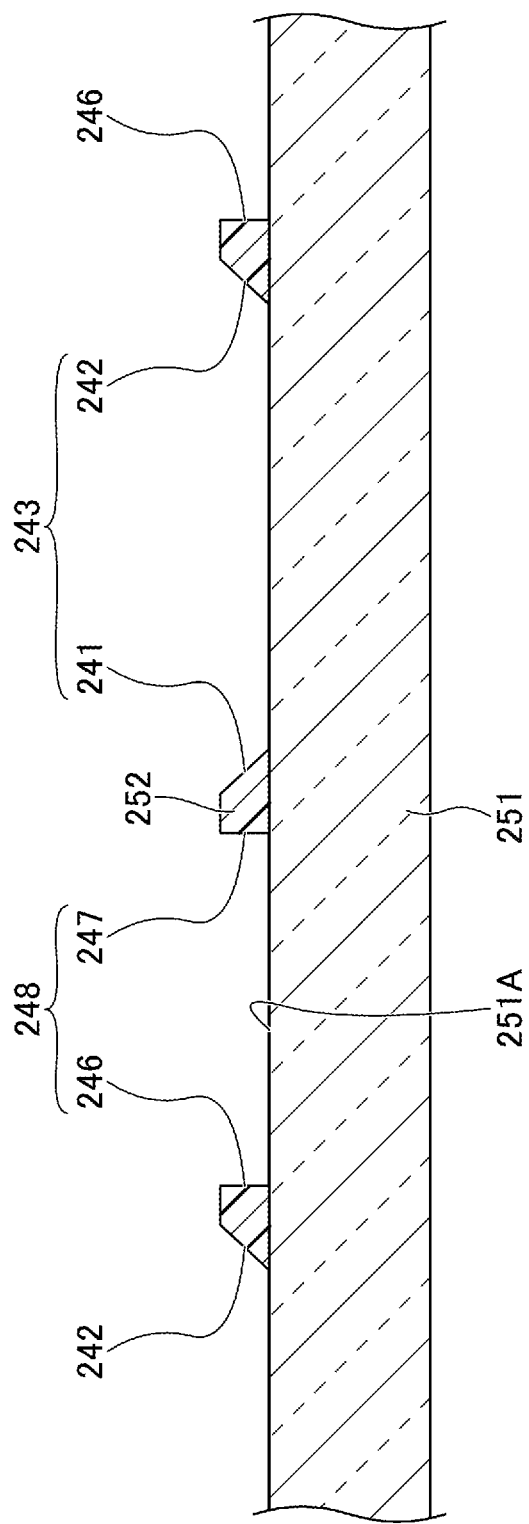
FIG. 32 is a cross sectional view (part 5) illustrating the first example of the mold forming method.

Next, as illustrated in FIG. 32, the photoresist film 252 is developed, to remove the photosensitive regions 260 and 265. As a result, an opening 243 having side surfaces 241 and 242, and an opening 248 having side surfaces 246 and 247, are formed in the photoresist film 252. The side surface 241 is formed at the position of the side surface 281 of the photosensitive region 260, and the side surface 242 is formed at the position of the side surface 271 of the photosensitive region 260. The side surface 246 is formed at the position of the side surface 291 of the photosensitive region 265, and the side surface 247 is formed at the position of the side surface 292 of the photosensitive region 265. The angle formed by the surface 251A and the side surfaces 241 and 242 may be in a range greater than or equal to 45° and less than or equal to 60°, for example, and the angle formed by the surface 251A and the side surfaces 246 and 247 may be in a range greater than or equal to 85° and less than or equal to 90°, for example. An alkaline developer is used to develop the photoresist film 252, for example.

Figure 33:
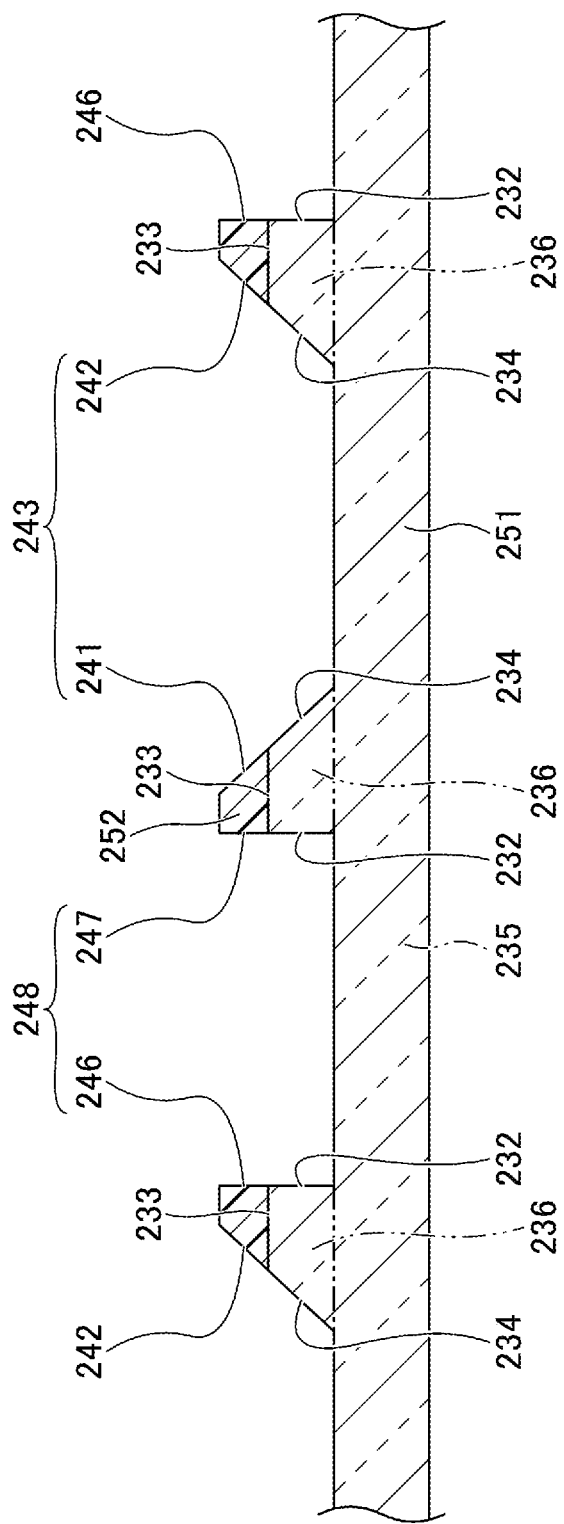
FIG. 33 is a cross sectional view (part 6) illustrating the first example of the mold forming method.

Next, as illustrated in FIG. 33, the base 235 and the plurality of protrusions 236 are formed on the quartz plate 251, by etching the quartz plate 251 through the openings 243 and 248. The protrusion 236 has the side surface 232 continuous with the side surface 246 or 247, and the side surface 234 continuous with the side surface 241 or 242. RIE is used for the etching described above, for example.

Figure 34:
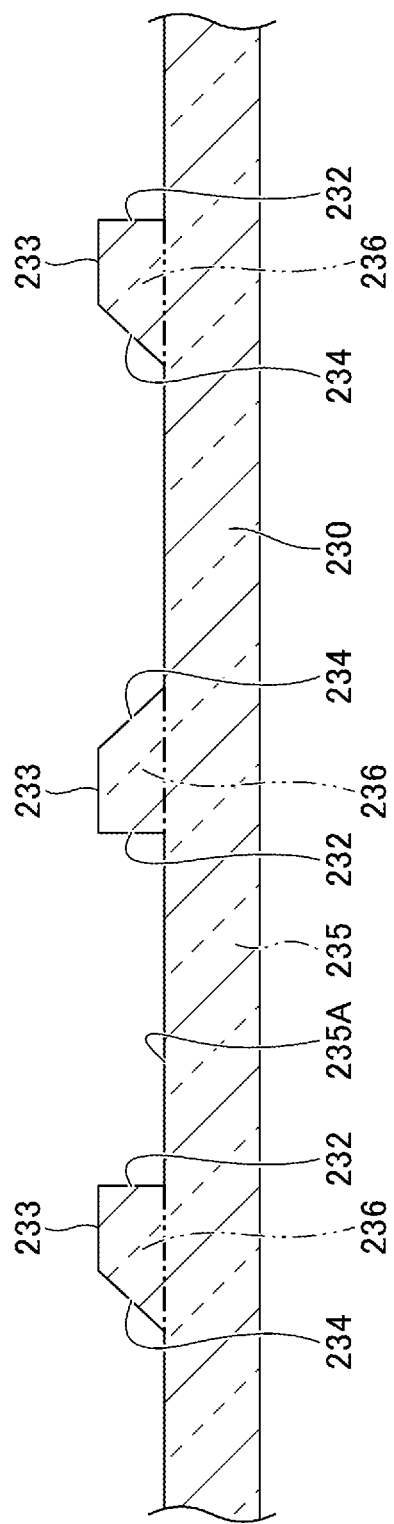
FIG. 34 is a cross sectional view (part 7) illustrating the first example of the mold forming method.

Next, as illustrated in FIG. 34, the photoresist film 252 is removed. The photoresist film 252 can be removed by using an organic solvent, oxygen plasma, or the like, for example. Hence, the mold 230 made of quartz can be formed in the above described manner.

Next, a second example of the method for forming the mold 230 will be described. FIG. 35 through FIG. 39 are cross sectional views illustrating the second example of the method for forming the mold 230. In this example, the mold 230 is formed of a resin.

Figure 35:
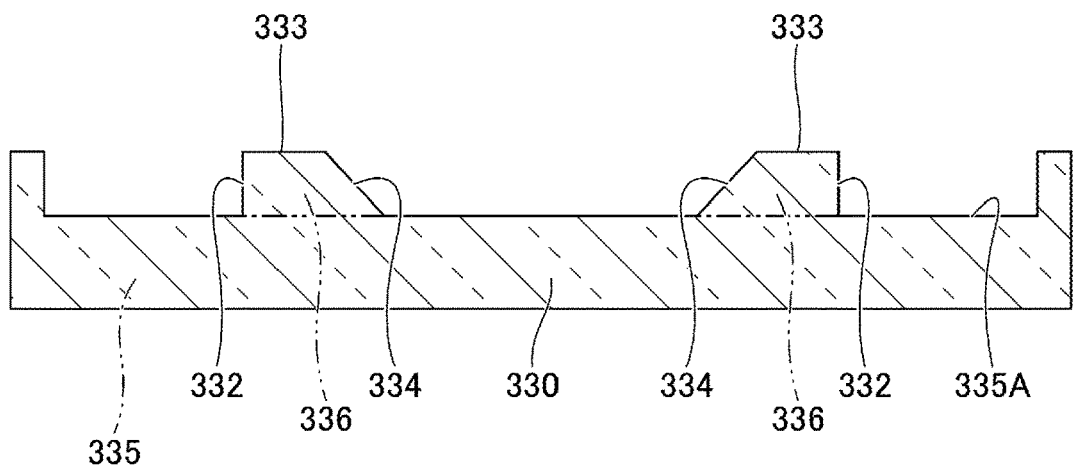
FIG. 35 is a cross sectional view (part 1) illustrating a second example of the mold forming method.

First, as illustrated in FIG. 35, a master mold 330 made of quartz is formed. The master mold 330 includes a flat base 335, and a plurality of protrusions 336 protruding from the base 335. The protrusions 336 protrude from one surface 335A of the base 335. The base 335 and the protrusions 336 have shapes similar to the shapes of the base 235 and the protrusions 236, respectively. The protrusion 336 has a surface 333 parallel to the surface 335A, a side surface 332, and a side surface 334. The master mold 330 has a shape corresponding to a repeating unit including two protrusions 236 that are adjacent to each other in the second direction of the mold 230.

Figure 36:
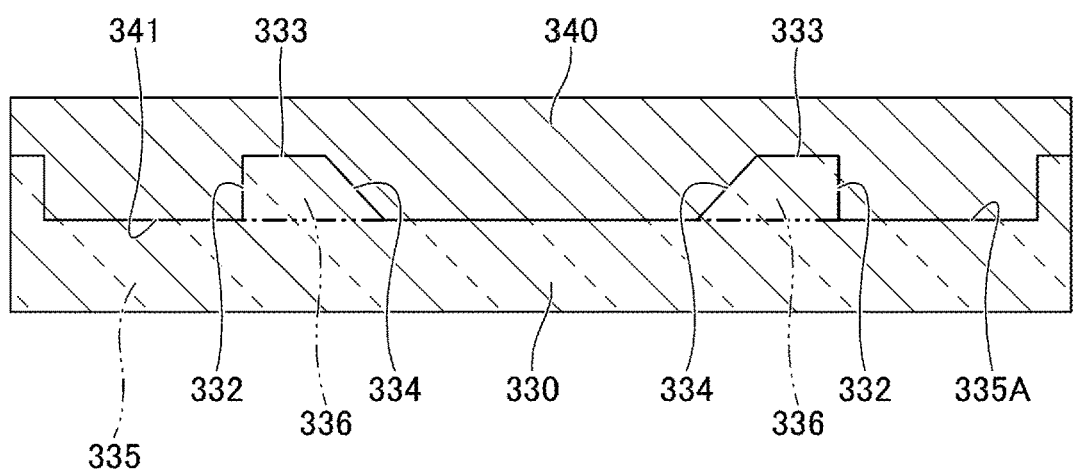
FIG. 36 is a cross sectional view (part 2) illustrating the second example of the mold forming method.

Next, as illustrated in FIG. 36, a transfer member 340 is formed on the master mold 330. The transfer member 340 is a nickel (Ni) film, for example. The transfer member 340 can be formed by nickel electroforming. The transfer member 340 is formed with a surface 341 having concavo-convexes conforming to the protrusions 336 of the master mold 330.

Figure 37:
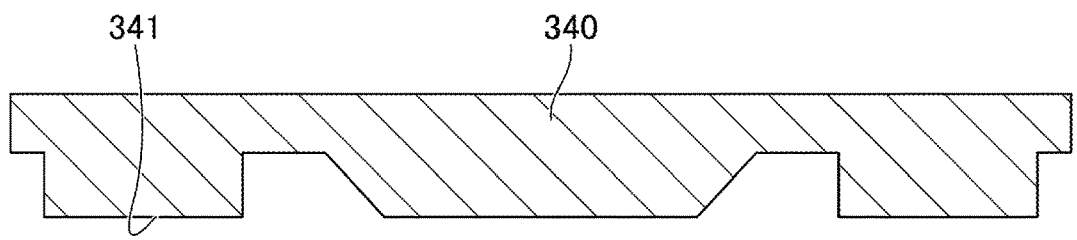
FIG. 37 is a cross sectional view (part 3) illustrating the second example of the mold forming method.

Next, as illustrated in FIG. 37, the transfer member 340 is released or parted from the master mold 330.

Figure 38:
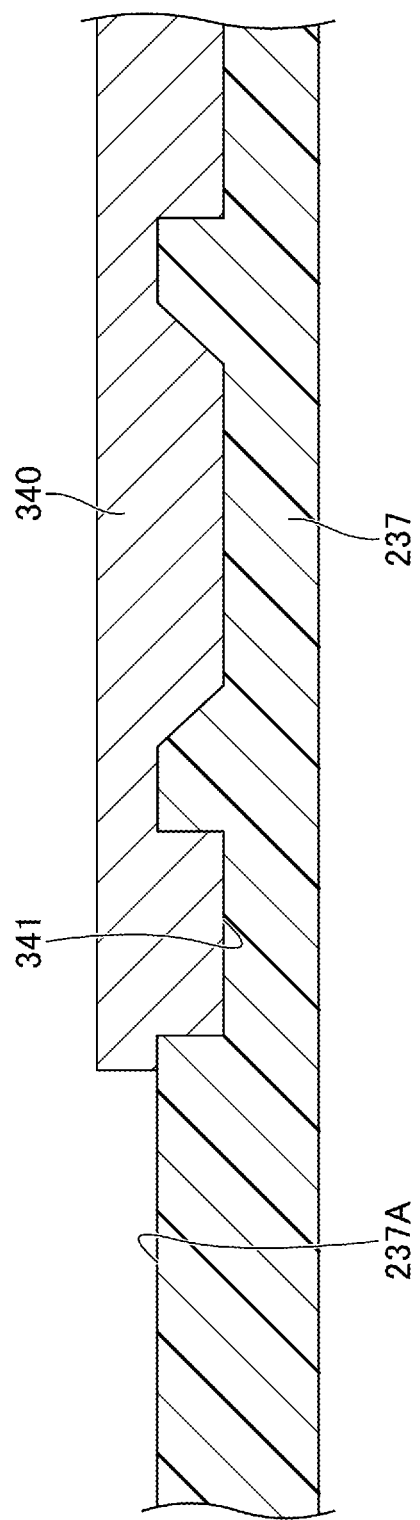
FIG. 38 is a cross sectional view (part 4) illustrating the second example of the mold forming method.

Next, as illustrated in FIG. 38, an uncured resin film 237 is prepared, and the transfer member 340 is pressed against one surface 237A of the resin film 237. As a result, concavo-convexes conforming to the surface 341 of the transfer member 340 are formed on the surface 237A. That is, the concavo-convexes conforming to the protrusions 336 of the master mold 330 are transferred to the surface 237A. The resin film 237 is a thermoplastic resin film or a UV curable resin film, for example. The resin film 237 may include a fluororesin, for example.

Figure 39:
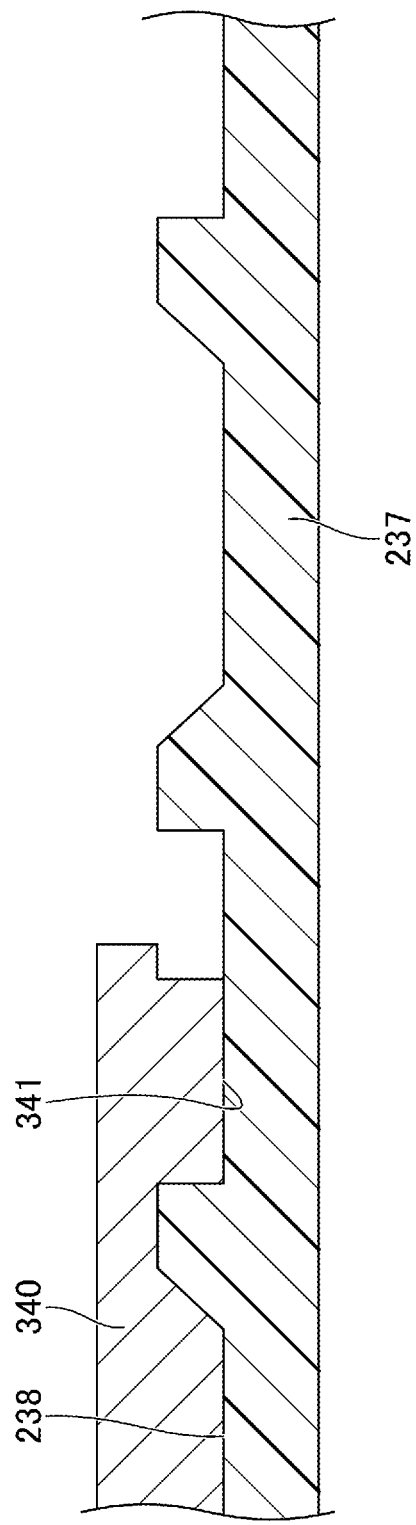
FIG. 39 is a cross sectional view (part 5) illustrating the second example of the mold forming method.

Thereafter, as illustrated in FIG. 39, the transfer of the concavo-convexes conforming to the protrusions 336 of the master mold 330 using the transfer member 340 is repeated. Then, after all of the concavo-convexes that become the protrusions 236 are formed, the resin film 237 is cured. The resin film 237 is heated in the case where the resin film 237 is the thermoplastic resin film, and UV light irradiation is performed in the case where the resin film 237 is the UV curable resin film. Hence, the resin mold 230 can be formed in the above described manner.

According to the present disclosure, it is possible to simultaneously relax the electric field concentration and reduce an increase in the electrostatic capacitance.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

Although the embodiment has been described in detail above, the embodiment is not limited to a specific embodiment, and various modifications and changes can be made within the scope described in the claims.

What is claimed is:

1. A method for manufacturing a semiconductor device, comprising:
    forming a semiconductor layer above a substrate;
    forming a source electrode and a drain electrode on the semiconductor layer;
    forming a first insulating film covering a surface of the semiconductor layer, between the source electrode and the drain electrode;
    forming a second insulating film on the first insulating film;
    forming a mask on the second insulating film, the mask having an opening between the source electrode and the drain electrode in a plan view viewed in a direction perpendicular to an upper surface of the substrate;
    forming a first gate opening in the first insulating film and forming a second gate opening in the second insulating film, by etching the first insulating film and the second insulating film through the opening; and
    forming a gate electrode on the first insulating film and the second insulating film, the gate electrode making a Schottky contact with the semiconductor layer through the first gate opening and the second gate opening,
    wherein:
    the opening includes
        a first side surface, and
        a second side surface closer to the drain electrode than the first side surface is to the drain electrode,
    an angle formed between the first side surface and the upper surface is larger than an angle formed between the second side surface and the upper surface,
    an etching rate of the second insulating film is higher than an etching rate of the first insulating film during the etching of the forming the first gate opening, and
    a distance between the first gate opening and the second gate opening on a side closer to the drain electrode than the first gate opening is to the drain electrode is longer than a distance between the first gate opening and the second gate opening on a side closer to the source electrode than the first gate opening is to the source electrode.

2. The method for manufacturing the semiconductor device as claimed in claim 1, wherein
    the first insulating film is a first silicon nitride film having a first refractive index, and
    the second insulating film is a second silicon nitride film having a second refractive index lower than the first refractive index.

3. The method for manufacturing the semiconductor device as claimed in claim 1, wherein
    the forming the mask includes
        forming a positive photosensitive film on the second insulating film,
        exposing the photosensitive film to form a photosensitive region in a portion of the photosensitive film where the opening is to be formed, and
        removing the photosensitive region by developing the photosensitive film, and
    the exposing the photosensitive film includes an exposure from a direction parallel to the first side surface, and exposure from a direction parallel to the second side surface.

4. The method for manufacturing the semiconductor device as claimed in claim 1, wherein the forming the mask includes
    forming a positive photosensitive film on the second insulating film,
    exposing the photosensitive film by a single exposure using a shifted telecentric optical system, to form a photosensitive region in a portion of the photosensitive film where the opening is to be formed, and
    removing the photosensitive region by developing the photosensitive film.

5. The method for manufacturing the semiconductor device as claimed in claim 1, wherein the forming the mask includes
    planarizing an upper surface of the second insulating film,
    forming an uncured film of a resin on the planarized second insulating film,
    forming a cured film by curing the uncured film while pressing a mold against the uncured film, and
    removing the mold from the cured film, and the mold includes a base, and a protrusion protruding from the base and having a shape corresponding to a shape of the opening.

6. The method for manufacturing a semiconductor device as claimed in claim 5, wherein
the resin is an ultraviolet curable resin, and
the forming the cured film includes irradiating ultraviolet light on the uncured film through the mold.

7. The method for manufacturing the semiconductor device as claimed in claim 5, wherein
the source electrode and the drain electrode extend in a first direction parallel to the upper surface, and are alternately formed at multiple locations in a second direction parallel to the upper surface and perpendicular to the first direction, and
the gate electrode is formed at each location between the source electrode and the drain electrode that are adjacent to each other in the second direction.

8. A method for manufacturing a semiconductor device, comprising:
forming a semiconductor layer above a substrate;
forming a source electrode and a drain electrode on the semiconductor layer;
forming a first insulating film covering a surface of the semiconductor layer, between the source electrode and the drain electrode;
forming a second insulating film on the first insulating film;
forming a mask on the second insulating film, the mask having an opening between the source electrode and the drain electrode in a plan view viewed in a direction perpendicular to an upper surface of the substrate;
forming a first gate opening in the first insulating film and forming a second gate opening in the second insulating film, by etching the first insulating film and the second insulating film through the opening; and
forming a gate electrode on the first insulating film and the second insulating film, the gate electrode making a Schottky contact with the semiconductor layer through the first gate opening and the second gate opening, wherein
the opening includes
a first side surface, and
a second side surface closer to the drain electrode than the first side surface is to the drain electrode,
an angle formed between the first side surface and the upper surface is larger than an angle formed between the second side surface and the upper surface,
an etching rate of the second insulating film is higher than an etching rate of the first insulating film during the etching of the forming the first gate opening,
an angle between the first side surface and the upper surface is in a range greater than or equal to 85° and less than or equal to 90°, and
an angle between the second side surface and the upper surface is in a range greater than or equal to 45° and less than or equal to 60°.

9. The method for manufacturing the semiconductor device as claimed in claim 8, wherein
the first insulating film is a first silicon nitride film having a first refractive index, and
the second insulating film is a second silicon nitride film having a second refractive index lower than the first refractive index.

10. The method for manufacturing the semiconductor device as claimed in claim 8, wherein
the forming the mask includes
forming a positive photosensitive film on the second insulating film,
exposing the photosensitive film to form a photosensitive region in a portion of the photosensitive film where the opening is to be formed, and
removing the photosensitive region by developing the photosensitive film, and
the exposing the photosensitive film includes an exposure from a direction parallel to the first side surface, and exposure from a direction parallel to the second side surface.

11. The method for manufacturing the semiconductor device as claimed in claim 8, wherein the forming the mask includes
forming a positive photosensitive film on the second insulating film,
exposing the photosensitive film by a single exposure using a shifted telecentric optical system, to form a photosensitive region in a portion of the photosensitive film where the opening is to be formed, and
removing the photosensitive region by developing the photosensitive film.

12. A method for manufacturing a semiconductor device, comprising:
forming a semiconductor layer above a substrate;
forming a source electrode and a drain electrode on the semiconductor layer;
forming a first insulating film covering a surface of the semiconductor layer, between the source electrode and the drain electrode:
forming a second insulating film on the first insulating film:
forming a mask on the second insulating film, the mask having an opening between the source electrode and the drain electrode in a plan view viewed in a direction perpendicular to an upper surface of the substrate:
forming a first gate opening in the first insulating film and forming a second gate opening in the second insulating film, by etching the first insulating film and the second insulating film through the opening; and
forming a gate electrode on the first insulating film and the second insulating film, the gate electrode making a Schottky contact with the semiconductor layer through the first gate opening and the second gate opening, wherein:
the opening includes
a first side surface, and
a second side surface closer to the drain electrode than the first side surface is to the drain electrode,
an angle formed between the first side surface and the upper surface is larger than an angle formed between the second side surface and the upper surface,
an etching rate of the second insulating film is higher than an etching rate of the first insulating film during the etching of the forming the first gate opening, and
an etching rate of the second insulating film is four times or more higher than an etching rate of the first insulating film during the etching of the forming the first gate opening.

13. The method for manufacturing the semiconductor device as claimed in claim 12, wherein
the first insulating film is a first silicon nitride film having a first refractive index, and
the second insulating film is a second silicon nitride film having a second refractive index lower than the first refractive index.

14. The method for manufacturing the semiconductor device as claimed in claim 12, wherein
the forming the mask includes
forming a positive photosensitive film on the second insulating film,
exposing the photosensitive film to form a photosensitive region in a portion of the photosensitive film where the opening is to be formed, and
removing the photosensitive region by developing the photosensitive film, and
the exposing the photosensitive film includes an exposure from a direction parallel to the first side surface, and exposure from a direction parallel to the second side surface.

15. The method for manufacturing the semiconductor device as claimed in claim 12, wherein the forming the mask includes
forming a positive photosensitive film on the second insulating film,
exposing the photosensitive film by a single exposure using a shifted telecentric optical system, to form a photosensitive region in a portion of the photosensitive film where the opening is to be formed, and
removing the photosensitive region by developing the photosensitive film.

\* \* \* \* \*